(12) United States Patent
Kim et al.

(10) Patent No.: US 11,114,398 B2
(45) Date of Patent: Sep. 7, 2021

(54) INTEGRATED CIRCUIT DEVICE INCLUDING SUPPORT PATTERNS AND METHOD OF MANUFACTURING THE SAME

(71) Applicant: Samsung Electronics Co., Ltd., Suwon-si (KR)

(72) Inventors: Dongwoo Kim, Hwaseong-si (KR); Hyukwoo Kwon, Seoul (KR); Seongmin Choo, Seoul (KR); Byoungdeog Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/848,194

(22) Filed: Apr. 14, 2020

(65) Prior Publication Data

US 2021/0082844 A1     Mar. 18, 2021

(30) Foreign Application Priority Data

Sep. 17, 2019  (KR) .................. 10-2019-0114365

(51) Int. Cl.
*H01L 23/00*     (2006.01)
(52) U.S. Cl.
CPC .... *H01L 24/05* (2013.01); *H01L 2924/10252* (2013.01); *H01L 2924/10253* (2013.01); *H01L 2924/14* (2013.01)

(58) Field of Classification Search
CPC combination set(s) only.
See application file for complete search history.

(56) References Cited

U.S. PATENT DOCUMENTS 8,288,224 B2   10/2012  Huang et al.
8,921,977 B2 *  12/2014  Huang .................... H01L 28/91
                                                        257/532

(Continued)

FOREIGN PATENT DOCUMENTS

KR   10-1090369 B1   12/2011

OTHER PUBLICATIONS

1st Office Action dated Jul. 9, 2021 by the German Patent and Trademark Office for corresponding German Patent Application No. 102020111636.5.

*Primary Examiner* — Mamadou L Diallo
(74) *Attorney, Agent, or Firm* — Muir Patent Law, PLLC

(57) ABSTRACT

An integrated circuit (IC) device includes a lower electrode formed on a substrate, and an upper support structure disposed around the lower electrode and supporting the lower electrode. The upper support structure includes an upper support pattern surrounding the lower electrode and extending in a lateral direction parallel to the substrate, the upper support pattern having a hole through which the lower electrode passes, and an upper spacer support pattern between the upper support pattern and the lower electrode inside the hole and having an outer sidewall in contact with the upper support pattern and an inner sidewall in contact with the lower electrode, wherein a width of the upper spacer support pattern in the lateral direction decreases in a direction toward the substrate. To manufacture an IC device, an upper support pattern is formed on a substrate. An upper spacer support film is formed to cover a sidewall and a top surface of the upper support pattern. A plurality of lower electrodes are formed inside a plurality of holes formed in the upper support pattern. Portions of the upper spacer support film are removed to form a plurality of upper spacer (Continued)

support patterns between the upper support pattern and the lower electrodes, respectively.

20 Claims, 18 Drawing Sheets

(56) References Cited

U.S. PATENT DOCUMENTS

| | | |
|---|---|---|
| 9,159,729 B2 | 10/2015 | Kim et al. |
| 9,293,336 B2 | 3/2016 | Yang et al. |
| 9,601,494 B2 | 3/2017 | Kim et al. |
| 9,673,272 B2 | 6/2017 | Choi et al. |
| 10,121,793 B2 | 11/2018 | Kim et al. |
| 10,249,706 B1 | 4/2019 | Chang et al. |
| 2008/0009119 A1* | 1/2008 | Eto .................. H01L 27/10852 438/386 |
| 2013/0277802 A1* | 10/2013 | Park .................. H01L 27/10894 257/532 |
| 2014/0065784 A1 | 3/2014 | Yoon et al. |
| 2014/0120683 A1* | 5/2014 | Kim ........................ H01L 28/91 438/381 |
| 2014/0145306 A1 | 5/2014 | Kim et al. |
| 2015/0279845 A1* | 10/2015 | Kishida ............. H01L 27/10835 257/306 |
| 2016/0365409 A1* | 12/2016 | Lee ........................ H01L 28/90 |
| 2017/0236894 A1* | 8/2017 | Kim .................. H01L 27/10808 257/532 |
| 2018/0166542 A1* | 6/2018 | Kim .................. H01L 21/31144 |
| 2019/0057858 A1 | 2/2019 | Hausmann et al. |
| 2019/0123051 A1* | 4/2019 | Park .................. H01L 21/02118 |
| 2019/0131386 A1 | 5/2019 | Yi et al. |
| 2021/0066066 A1* | 3/2021 | Lee ....................... H01L 21/302 |

* cited by examiner

INTEGRATED CIRCUIT DEVICE INCLUDING SUPPORT PATTERNS AND METHOD OF MANUFACTURING THE SAME

CROSS-REFERENCE TO RELATED APPLICATION

This application claims priority under 35 U.S.C § 119 to Korean Patent Application No. 10-2019-0114365, filed on Sep. 17, 2019, in the Korean Intellectual Property Office, the disclosure of which is incorporated herein in its entirety by reference.

BACKGROUND

The inventive concept relates to an integrated circuit (IC) device and a method of manufacturing the same, and more particularly, to an IC device including a capacitor and a method of manufacturing the same.

Due to development of electronic technology, downscaling of semiconductor devices has rapidly progressed, and thus, patterns constituting electronic devices have been downscaled. Accordingly, there is a need to develop a structure that may include a downscaled capacitor having an improved capacitance and that maintains desired electrical characteristics.

SUMMARY

The inventive concept provides an integrated circuit (IC) device, which may prevent a plurality of lower electrodes of a plurality of capacitors from being tilted or collapsing even if heights of the lower electrodes are increased or aspect ratios of the lower electrodes are relatively increased, so that the occurrence of undesired short circuits between adjacent lower electrodes may be reduced/prevented.

The inventive concept also provides a method of manufacturing an IC device, which may prevent a plurality of lower electrodes of a plurality of capacitors from being tilted or collapsing even if heights of the lower electrodes are increased or aspect ratios of the lower electrodes are relatively increased, so that the reliability and mass production efficiency of the IC device may be improved.

According to an aspect of the inventive concept, there is provided an IC device including a lower electrode formed on a substrate, and an upper support structure configured to support the lower electrode, the upper support structure disposed around the lower electrode. The upper support structure includes an upper support pattern surrounding the lower electrode and extending in a lateral direction parallel to the substrate. The upper support pattern has a hole through which the lower electrode passes. An upper spacer support pattern is interposed between the upper support pattern and the lower electrode inside the hole. The upper spacer support pattern has an outer sidewall in contact with the upper support pattern and an inner sidewall in contact with the lower electrode. A width of the upper spacer support pattern in the lateral direction decreases in a direction toward the substrate.

It will be understood that when an element is referred to as being "connected," "coupled to" or "on" another element, it can be directly connected/coupled to/on the other element or intervening elements may be present. In contrast, when an element is referred to as being "directly connected" or "directly coupled" to another element, or as "contacting" or "in contact with" another element, there are no intervening elements present.

According to another aspect of the inventive concept, there is provided an IC device including a plurality of lower electrodes arranged on a substrate and spaced apart from each other. An upper support pattern extends in a lateral direction parallel to the substrate. The upper support pattern has a plurality of holes through which the plurality of lower electrodes pass. A plurality of upper spacer support patterns are arranged inside the plurality of holes in a one-to-one manner. Each of the plurality of upper spacer support patterns includes an outer sidewall in contact with the upper support pattern and an inner sidewall in contact with a corresponding one of the plurality of lower electrodes. Each of the plurality of upper spacer support patterns has a width in the lateral direction, the width decreasing in a direction toward the substrate.

According to another aspect of the inventive concept, there is provided an IC device including a plurality of lower electrodes arranged on a substrate and spaced apart from each other. An upper support structure includes an upper support pattern and a plurality of upper spacer support patterns. The upper support pattern extends in a lateral direction parallel to the substrate and has a plurality of holes through which the plurality of lower electrodes pass. The plurality of upper spacer support patterns are arranged inside the plurality of holes in a one-to-one manner. A lower support pattern extends in the lateral direction between the substrate and the upper support structure and is in contact with the plurality of lower electrodes. A dielectric film is in contact with the plurality of lower electrodes, the upper support pattern, the plurality of upper spacer support patterns, and the lower support pattern. An upper electrode is located opposite to the plurality of lower electrodes with the dielectric film therebetween. Each of the plurality of upper spacer support patterns has an outer sidewall in contact with the upper support pattern inside a corresponding one of the plurality of holes and an inner sidewall in contact with a corresponding one of the plurality of lower electrodes. Each of the plurality of upper spacer support patterns has a width in the lateral direction, the width decreasing in a direction toward the substrate.

According to another aspect of the inventive concept, there is provided a method of manufacturing an IC device. The method includes forming a mold structure pattern including a mold pattern and an upper support pattern, which are sequentially stacked on a substrate. The mold structure pattern has a plurality of holes. An upper spacer support film is formed to cover a sidewall and a top surface of the upper support pattern. A plurality of lower electrodes are formed inside the plurality of holes, respectively, to be in contact with the upper spacer support film and the mold pattern. A plurality of upper spacer support patterns are formed by removing portions of the upper spacer support film to expose a top surface of the upper support pattern. The plurality of upper spacer support patterns are interposed between the upper support pattern and the plurality of lower electrodes, respectively. The mold pattern is removed to expose a sidewall of each of the plurality of lower electrodes.

According to another aspect of the inventive concept, there is provided a method of manufacturing an IC device. The method includes forming a mold structure on a substrate. The mold structure includes a mold film and an upper support film covering the mold film. A plurality of holes are formed through the mold structure to form a mold structure pattern. The mold structure pattern includes a mold pattern and an upper support pattern, which define the plurality of holes. An upper spacer support film is formed to cover an upper portion of the mold structure pattern inside each of the plurality of holes. A plurality of lower electrodes are formed inside the plurality of holes, respectively. A plurality of upper spacer support patterns are formed by removing portions of the upper spacer support film to expose a top surface of the upper support pattern. The plurality of upper spacer support patterns are interposed between the upper support pattern and the plurality of lower electrodes, respectively. Portions of the upper support pattern are removed to form a plurality of upper holes exposing the mold pattern. The mold pattern is removed through the plurality of upper holes to expose the plurality of lower electrodes between the substrate and the plurality of upper spacer support patterns A dielectric film is formed to be in contact with a surface of each of the plurality of lower electrodes, a surface of the upper support pattern, and each of the plurality of upper spacer support patterns. An upper electrode is formed on the dielectric film.

According to another aspect of the inventive concept, there is provided a method of manufacturing an IC device. The method includes forming a mold structure pattern including a mold pattern and an upper support pattern, which are sequentially stacked on a substrate. The mold structure pattern has a plurality of holes. An upper spacer support film is formed to cover a sidewall and a top surface of the upper support pattern. The upper spacer support film has a carbon atom content higher than a carbon atom content of a material included in the upper support pattern. A plurality of lower electrodes are formed inside the plurality of holes, respectively, to be in contact with the upper spacer support film. A plurality of upper spacer support patterns are formed by removing portions of the upper spacer support film to expose the top surface of the upper support pattern. The plurality of upper spacer support patterns are interposed between the upper support pattern and the plurality of lower electrodes, respectively. The mold pattern are removed to expose a sidewall of each of the plurality of lower electrodes.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
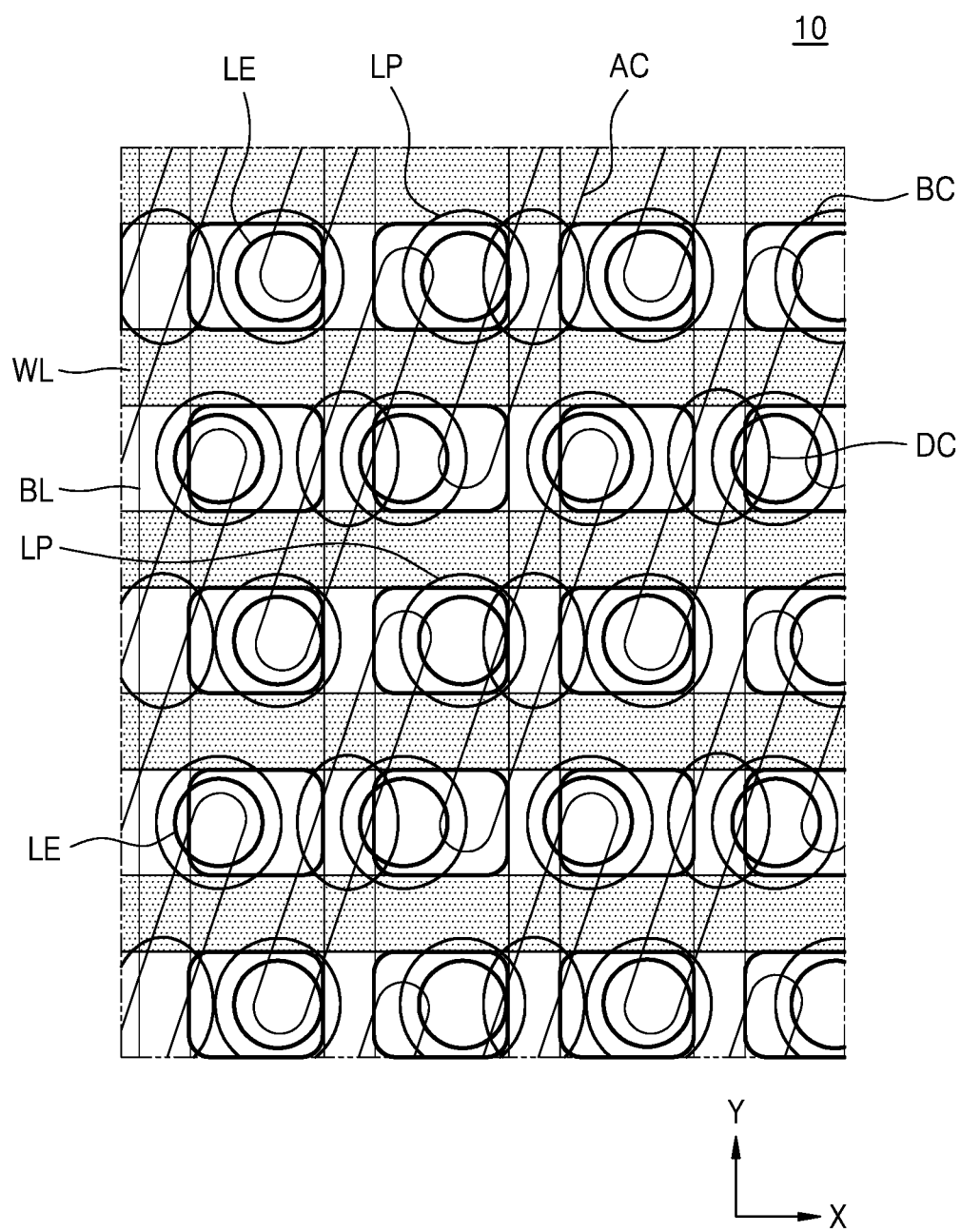
FIG. 1 is a schematic plan layout of some components of a memory cell array region of an integrated circuit (IC) device according to an embodiment.

Embodiments will now be described more fully with reference to the accompanying drawings in which some embodiments are shown. The same reference numerals are used to denote the same elements throughout the drawings, repeated descriptions thereof may be omitted.

FIG. 1 is a schematic plan layout of some components of a memory cell array region of an integrated circuit (IC) device 10 according to an embodiment.

Referring to FIG. 1, the IC device 10 may include a plurality of active regions AC, which extend parallel to each other at an angle to each of an X direction and a Y direction on a plane. A plurality of word lines WL may extend across the plurality of active regions AC parallel to each other in the X direction. A plurality of bit lines BL may extend on the plurality of word lines WL parallel to each other in the Y direction that intersects with the X direction. For example, the X and Y directions may be perpendicular to each other. Each of the plurality of bit lines BL may be connected to the active region AC through a direct contact DC.

A plurality of buried contacts BC may be formed between two adjacent ones of the plurality of bit lines BL. A plurality of conductive landing pads LP may be respectively formed on the plurality of buried contacts BC. Each of the plurality of conductive landing pads LP may be arranged to at least partially overlap the buried contact BC. A plurality of lower electrodes LE may be respectively formed on the plurality of conductive landing pads LP. The plurality of lower electrodes LE may be connected to the plurality of active regions AC through the plurality of buried contacts BC and the plurality of conductive landing pads LP.

Figure 2A:
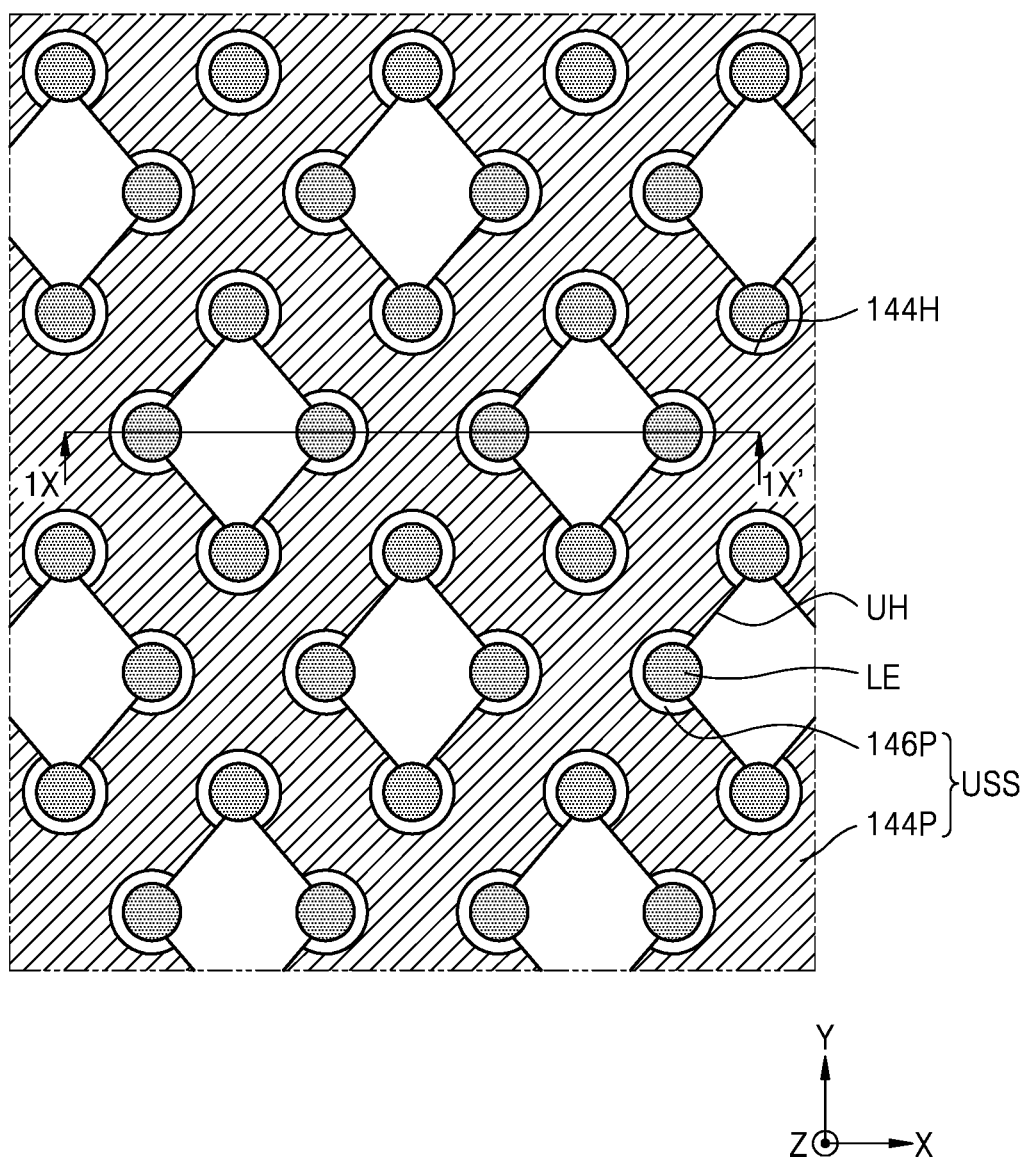
FIG. 2A is a plan view of some components of an IC device according to an embodiment.
Figure 2B:
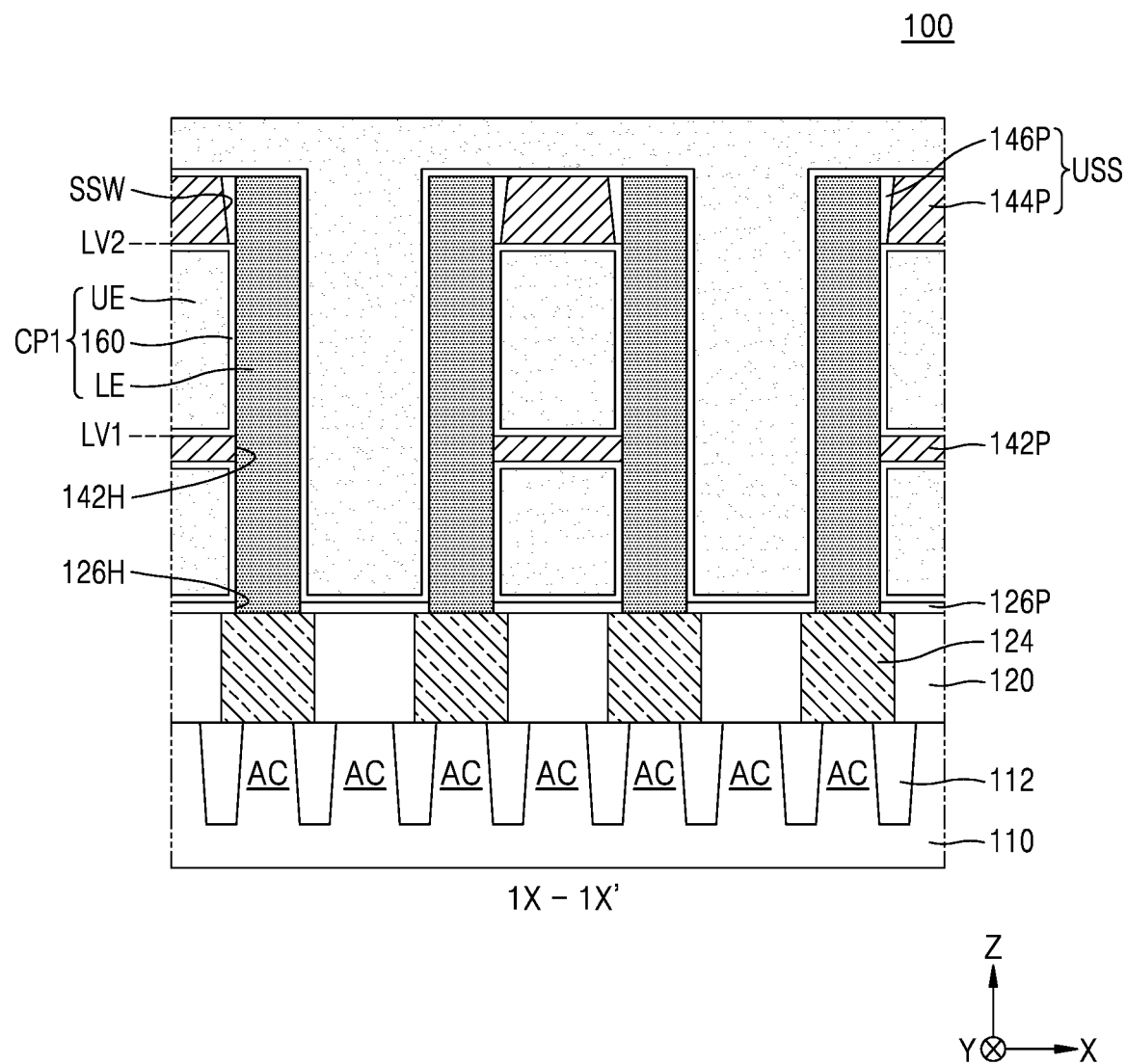
FIG. 2B is a schematic cross-sectional view of some components of the IC device, which is taken along line 1X-1X' of FIG. 2A.

FIG. 2A is a plan view of some components of an IC device 100 according to an embodiment. FIG. 2B is a schematic cross-sectional view of some components of the IC device 100, which is taken along line 1X-1X' of FIG. 2A.

Referring to FIGS. 2A and 2B, the IC device 100 may constitute a portion of the IC device 10 shown in FIG. 1. Some components of the IC device 100 are omitted or briefly illustrated in FIGS. 2A and 2B. However, the configuration of the IC device 100 is not limited to those shown in FIGS. 2A and 2B and is interpreted as including characteristic configurations that will be described below.

The IC device 100 may include a substrate 110 including a plurality of active regions AC and a lower structure 120 formed on the substrate 110. A plurality of conductive regions 124 may pass through the lower structure 120 and be respectively connected to the plurality of active regions AC.

The substrate 110 may include a semiconductor element, such as silicon (Si) and germanium (Ge), or a compound semiconductor, such as silicon carbide (SiC), gallium arsenide (GaAs), indium arsenide (InAs), and indium phosphide (InP). The substrate 110 may include a semiconductor substrate, and at least one insulating film or structures including at least one conductive region formed on the semiconductor substrate. The conductive region may include, for example, a doped well or a doped structure. A device isolation region 112 may be formed in the substrate 110 to define the plurality of active regions AC. The device isolation region 112 may include an oxide film, a nitride film, or a combination thereof.

In some embodiments, the lower structure 120 may include an insulating film, which includes a silicon oxide film, a silicon nitride film, or a combination thereof. In some other embodiments, the lower structure 120 may include various conductive regions, for example, an interconnection layer, a contact plug, a transistor, and an insulating film configured to insulate the interconnection layer, the contact plug, and the transistor from each other. The plurality of conductive regions 124 may include polysilicon, a metal, a conductive metal nitride, a metal silicide, or a combination thereof. The lower structure 120 may include the plurality of bit lines BL described with reference to FIG. 1. Each of the plurality of conductive regions 124 may include the buried contact BC and the conductive landing pad LP, which are described with reference to FIG. 1.

An insulating pattern 126P having a plurality of openings 126H may be arranged on the lower structure 120 and the plurality of conductive regions 124. The insulating pattern 126P may include a silicon nitride film, a silicon carbon nitride film, a boron-containing silicon nitride film, or a combination thereof.

A plurality of capacitors CP1 including a plurality of lower electrodes LE, a dielectric film 160, and an upper electrode UE may be arranged on the plurality of conductive regions 124. Each of the plurality of lower electrodes LE may have a pillar shape, which extends long from a top surface of the conductive region 124 through the opening 126H of the insulating pattern 126P in a direction away from the substrate 110 in a vertical direction (Z direction). For example, the Z direction is perpendicular to the X and Y directions. The dielectric film 160 and the upper electrode UE may be sequentially formed on the plurality of lower electrodes LE. Although FIGS. 2A and 2B illustrate an example in which each of the plurality of lower electrodes LE has a pillar shape, the inventive concept is not limited thereto. For instance, each of the plurality of lower electrodes LE may have a sectional structure having a cup shape or a cylindrical shape with a blocked bottom. For example, each of the lower electrodes may have a U-shape cross-sectional view. The plurality of lower electrodes LE may be opposite to the upper electrode UE with the dielectric film 160 therebetween.

Each of the plurality of lower electrodes LE and the upper electrode UE may include a metal film, a conductive metal oxide film, a conductive metal nitride film, a conductive metal oxynitride film, or a combination thereof. In some embodiments, each of the plurality of lower electrodes LE and the upper electrode UE may include titanium (Ti), Ti oxide, Ti nitride, Ti oxynitride, cobalt (Co), Co oxide, Co nitride, Co oxynitride, niobium (Nb), Nb oxide, Nb nitride, Nb oxynitride, tin (Sn), Sn oxide, Sn nitride, Sn oxynitride, or a combination thereof. For example, each of the lower electrodes LE and the upper electrodes UE may include, but not limited to, TiN, CoN, NbN, $SnO_2$, or a combination thereof. The dielectric film 160 may include, but not limited to, $HfO_2$, $ZrO_2$, $Al_2O_3$, $La_2O_3$, $Ta_2O_3$, $Nb_2O_5$, $CeO_2$, $TiO_2$, $GeO_2$, or a combination thereof.

The plurality of lower electrodes LE may be supported by a lower support pattern 142P and an upper support structure USS.

The upper support structure USS may include an upper support pattern 144P and a plurality of upper spacer support patterns 146P. The upper support pattern 144P may extend in a lateral direction parallel to the substrate 110 while surrounding an upper end of each of the plurality of lower electrodes LE at a position spaced apart from the plurality of lower electrodes LE. A plurality of holes 144H (e.g., shown in FIG. 8C) through which the plurality of lower electrodes LE pass may be formed in the upper support pattern 144P. The plurality of upper spacer support patterns 146P may be arranged inside the plurality of holes 144H formed in the upper support pattern 144P in a one-to-one manner. For example, each of the plurality of upper spacer support patterns 146P may be disposed between the upper support pattern 144P and a corresponding lower electrode LE inside the hole 144H formed in the upper support pattern 144P. Each of the plurality of upper spacer support patterns 146P may have an outer sidewall in contact with the upper support pattern 144P and an inner sidewall in contact with the corresponding lower electrode LE. Each of the plurality of upper spacer support patterns 146P may have a smaller width toward the substrate 110 in the lateral direction. For example, the width, or a thickness, of each of the upper spacer support patterns 146P in a horizontal/lateral direction parallel with the top surface of the substrate 110 may decrease from the top to the bottom of the upper spacer support pattern 146P. For example, the upper spacer support patterns 146P may have different widths in the horizontal/lateral direction.

An inner sidewall of each of the plurality of holes 144H formed in the upper support pattern 144P may include an inclined sidewall SSW, which is located apart from and opposite to the corresponding lower electrode LE with the corresponding upper spacer support pattern 146P therebetween. For example, the inclined sidewall SSW may have an acute angle with respect to the top surface of the substrate 110. The inclined sidewall SSW may be inclined such that the inclined sidewall SSW becomes closer to the lower electrode LE in a direction toward the substrate 110. For example, lateral distances between the lower electrode LE and the inclined side wall SSW may be gradually decreased along the direction toward the substrate 110. The upper spacer support pattern 146P may include a portion having a reverse trapezoidal sectional shape of which a width is reduced toward the substrate 110. For example, the reverse trapezoidal sectional shape of the upper spacer support pattern 146P may have a lower side extending in a lateral direction, an upper side extending in the lateral direction and two other sides respectively connecting ends of the lower and upper sides, and a length of the upper side is greater than that of the lower side. A top surface of each of the plurality of lower electrodes LE, a top surface of the upper support pattern 144P, and a top surface of each of the plurality of upper spacer support patterns 146P may be coplanar.

The lower support pattern 142P may extend in the lateral direction parallel to the substrate 110 between the substrate 110 and the upper support structure USS and be in contact with the plurality of lower electrodes LE. A plurality of holes 142H through which the plurality of lower electrodes LE pass, and a plurality of lower holes (refer to LH in FIG. 8G) may be formed in the lower support pattern 142P. The plurality of lower electrodes LE may pass through the plurality of holes 144H formed in the upper support pattern 144P and the plurality of holes 142H formed in the lower support pattern 142P and extend in a vertical direction (Z direction).

Each of the plurality of upper spacer support patterns 146P may be located in a space between the upper support pattern 144P and the lower electrode LE and may not include a portion located in a space between a top level LV1 of the lower support pattern 142P and a bottom level LV2 of the upper support pattern 144P. For example, the bottom surface of each of the upper spacer support patterns 146P may be at the same or a higher level than the bottom surface of its corresponding upper support pattern 144P. As used herein, a term "level" refers to a distance from a top surface of the substrate 110 in a vertical direction (Z direction or −Z direction).

A plurality of upper holes UH may be formed in the upper support structure USS including the upper support pattern 144P and the plurality of upper spacer support patterns 146P. As illustrated in FIG. 2A, a planar shape of each of the plurality of upper holes UH may be approximately a rhombic planar shape having four adjacent lower electrodes LE as vertices. For example, the lengths of the four sides of the rhombic planar shape connecting four adjacent lower electrodes LE may be the same. However, the planar shape of each of the plurality of upper holes UH is not limited to the example shown in FIG. 2A and may be variously modified and changed within the scope of the inventive concept. A plurality of lower holes (refer to LH in FIG. 8G), each of which has a planar shape corresponding to the planar shape of each of the plurality of upper holes UH, may be formed in the lower support pattern 142P.

Terms such as "about" or "approximately" used herein may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Each of the plurality of upper spacer support patterns 146P may have a ring shape, which is arranged concentrically with the lower electrode LE and surrounds the upper end of the lower electrode LE. However, each of at least some of the plurality of upper spacer support patterns 146P may not surround the lower electrode LE in a closed ring shape but may surround the lower electrode LE in an open ring shape in which a portion of a closed ring is removed. An open portion omitted from a ring forming the upper spacer support pattern 146P may be included in the upper hole UH. For example, the open portion omitted from the upper spacer support pattern 146P may be integrally formed with the upper hole UH. For example, the open portion omitted from the upper spacer support pattern 146P may be a unitary space with the upper hole UH.

Each of the lower support pattern 142P and the upper support pattern 144P may include a silicon carbon nitride film, a boron-containing silicon nitride film, or a combination thereof. In some embodiments, the lower support pattern 142P and the upper support pattern 144P may include the same material. In some other embodiments, the lower support pattern 142P and the upper support pattern 144P may include different materials. In an example, each of the lower support pattern 142P and the upper support pattern 144P may include a silicon carbon nitride film. In another example, the lower support pattern 142P may include a silicon carbon nitride film, and the upper support pattern 144P may include a boron-containing silicon nitride film. However, according to embodiments, materials included in a lower support film 142 and an upper support film 144 are not limited to the above-described examples and may be variously modified and changed within the scope of the inventive concept. The lower support film 142 and the upper support film 144 are layers respectively formed into the lower and upper support patterns 142P and 144P.

The upper spacer support pattern 146P may include a silicon carbon nitride film, a boron-containing silicon nitride film, or a combination thereof.

In some embodiments, the lower support pattern 142P, the upper support pattern 144P, and the upper spacer support pattern 146P may include the same material. For example, each of the lower support pattern 142P, the upper support pattern 144P, and the upper spacer support pattern 146P may include a silicon carbon nitride film.

In some other embodiments, the lower support pattern 142P, the upper support pattern 144P, and the upper spacer support pattern 146P may include a first material including the same elements (e.g., the same chemical elements). However, at least some of the lower support pattern 142P, the upper support pattern 144P, and the upper spacer support pattern 146P may include the elements included in the first material at different contents. For example, each of the lower support pattern 142P, the upper support pattern 144P, and the upper spacer support pattern 146P may include a silicon carbon nitride film. In this case, the silicon carbon nitride film included in the lower support pattern 142P and the upper support pattern 144P may have a first carbon atom content, and the silicon carbon nitride film included in the upper spacer support pattern 146P may have a second carbon atom content. Here, the second carbon atom content may be higher than the first carbon atom content. In some embodiments, a carbon content of each of the lower support pattern 142P and the upper support pattern 144P may be selected in the range of about 3.5 atomic percent (at %) to about 4.5 at %, and a carbon content of the upper spacer support pattern 146P may be selected in the range of about 4.5 at % to about 5.5 at %. For example, each of the lower support pattern 142P and the upper support pattern 144P may include a silicon carbon nitride film having a carbon content of about 3.7 at % to about 4.3 at %, and the upper spacer support pattern 146P may include a silicon carbon nitride film having a carbon content of about 4.7 at % to about 5.3 at %.

In some other embodiments, at least some of the lower support pattern 142P, the upper support pattern 144P, and the upper spacer support pattern 146P may have different densities. For example, each of the lower support pattern 142P, the upper support pattern 144P, and the upper spacer support pattern 146P may include a material including the same elements (e.g., the same chemical elements). In this case, a density of the material included in the lower support pattern 142P and the upper support pattern 144P may be higher than a density of the material included in the upper spacer support pattern 146P. For example, the lower support pattern 142P and the upper support pattern 144P may include a silicon carbon nitride film having a first density, and the upper spacer support pattern 146P may include a silicon carbon nitride film having a second density, the second density being lower than the first density.

In still other embodiments, a material included in the lower support pattern 142P and the upper support pattern 144P may be different from a material included in the upper spacer support pattern 146P. In an example, the lower support pattern 142P and the upper support pattern 144P may include a silicon carbon nitride film, and the upper spacer support pattern 146P may include a boron-containing silicon nitride film. In another example, the lower support pattern 142P and the upper support pattern 144P may include a boron-containing silicon nitride film, and the upper spacer support pattern 146P may include a silicon carbon nitride film.

In the IC device 100 described with reference to FIGS. 2A and B, spaces between the upper ends of the plurality of lower electrodes LE may be filled with the upper support pattern 144P and the upper spacer support pattern 146P. Thus, a sufficient separation distance may be ensured between the plurality of lower electrodes LE by the upper support pattern 144P and the upper spacer support pattern 146P. Accordingly, even if heights of the plurality of lower electrodes LE are increased and aspect ratios of the plurality of lower electrodes LE are relatively increased to improve capacitances of the plurality of capacitors CP1, the plurality of lower electrodes LE may be prevented from being tilted or collapsing. As a result, the occurrence of undesired short circuits between adjacent lower electrodes LE may be prevented/reduced.

Figure 3:
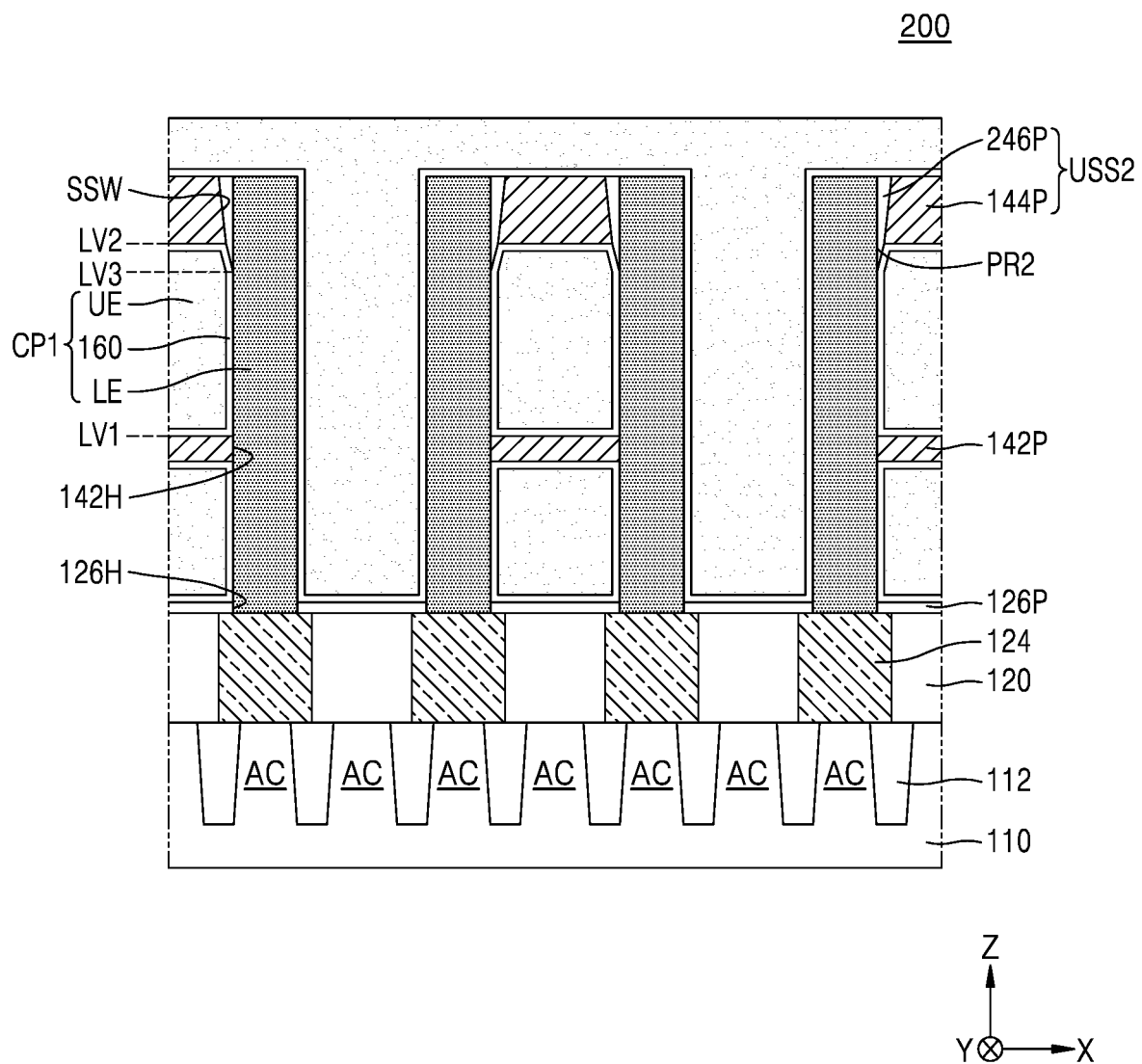
FIG. 3 is a schematic cross-sectional view of some components of an IC device according to an embodiment.

FIG. 3 is a schematic cross-sectional view of some components of an IC device 200 according to an embodiment. In FIG. 3, the same reference numerals are used to denote the same elements as in FIGS. 2A and 2B, and detailed descriptions thereof may be omitted.

Referring to FIG. 3, the IC device 200 may have substantially the same configuration as the IC device 100 described with reference to FIGS. 2A and 2B. However, the IC device 200 may include an upper support structure USS2 configured to support a plurality of lower electrodes LE.

The upper support structure USS2 may include an upper support pattern 144P and a plurality of upper spacer support patterns 246P. The plurality of upper spacer support patterns 246P may have substantially the same configurations as the upper spacer support pattern 146P described with reference to FIGS. 2A and 2B. However, each of the plurality of upper spacer support patterns 246P may include a protrusion PR2, which extends toward a substrate 110 to a level LV3 lower than a bottom level LV2 of the upper support pattern 144P to cover a sidewall of the lower electrode LE between a top level LV1 of a lower support pattern 142P and the bottom level LV2 of the upper support pattern 144P. The protrusion PR2 may be between the lower electrode LE and a dielectric film 160. For example, the protrusion PR2 may cover a portion of the sidewall of the lower electrode LE between the lower electrode LE and the dielectric film 160. In some embodiments, the protrusion PR2 of the upper spacer support pattern 246P may have an inverted triangular sectional shape.

Figure 4:
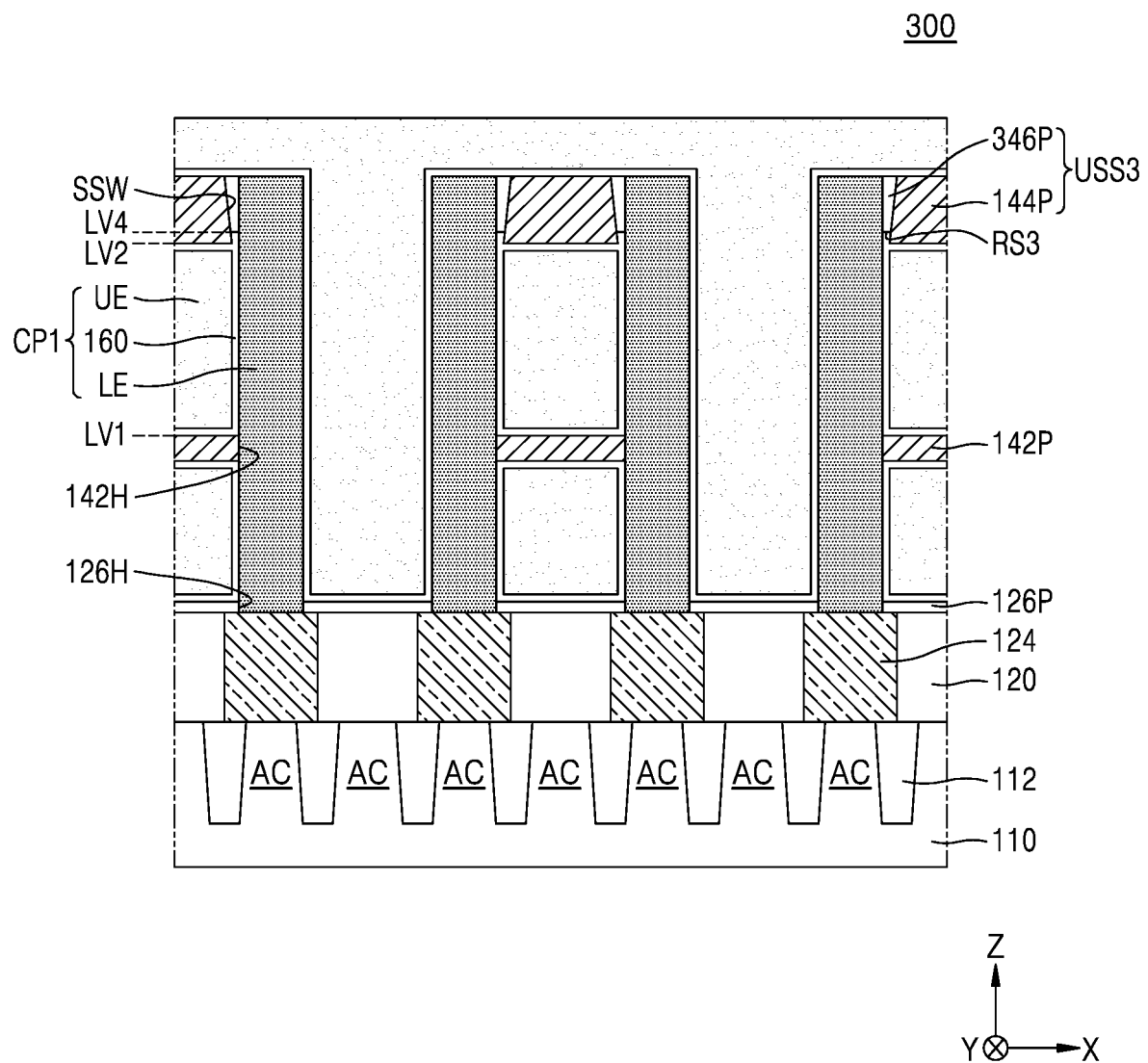
FIG. 4 is a schematic cross-sectional view of some components of an IC device according to an embodiment.

FIG. 4 is a schematic cross-sectional view of some components of an IC device 300 according to an embodiment. In FIG. 4, the same reference numerals are used to denote the same elements as in FIGS. 2A and 2B, and detailed descriptions thereof may be omitted.

Referring to FIG. 4, the IC device 300 may have substantially the same configuration as the IC device 100 described with reference to FIGS. 2A and 2B. However, the IC device 300 may include an upper support structure USS3 configured to support a plurality of lower electrodes LE.

The upper support structure USS3 may include an upper support pattern 144P and a plurality of upper spacer support patterns 346P. The plurality of upper spacer support patterns 346P may have substantially the same configurations as the upper spacer support patterns 146P described with reference to FIGS. 2A and 2B. However, each of the plurality of upper spacer support patterns 346P may have a bottom surface RS3 that is at a level LV4 higher than the bottom level LV2 of the upper support pattern 144P.

A dielectric film 160 may include a portion in contact with the bottom surface RS3 of each of the plurality of upper spacer support patterns 346P. The portion of the dielectric film 160, which is in contact with the bottom surface RS3 of the upper spacer support pattern 346P, may be between the lower electrode LE and the upper support pattern 144P.

Figure 5A:
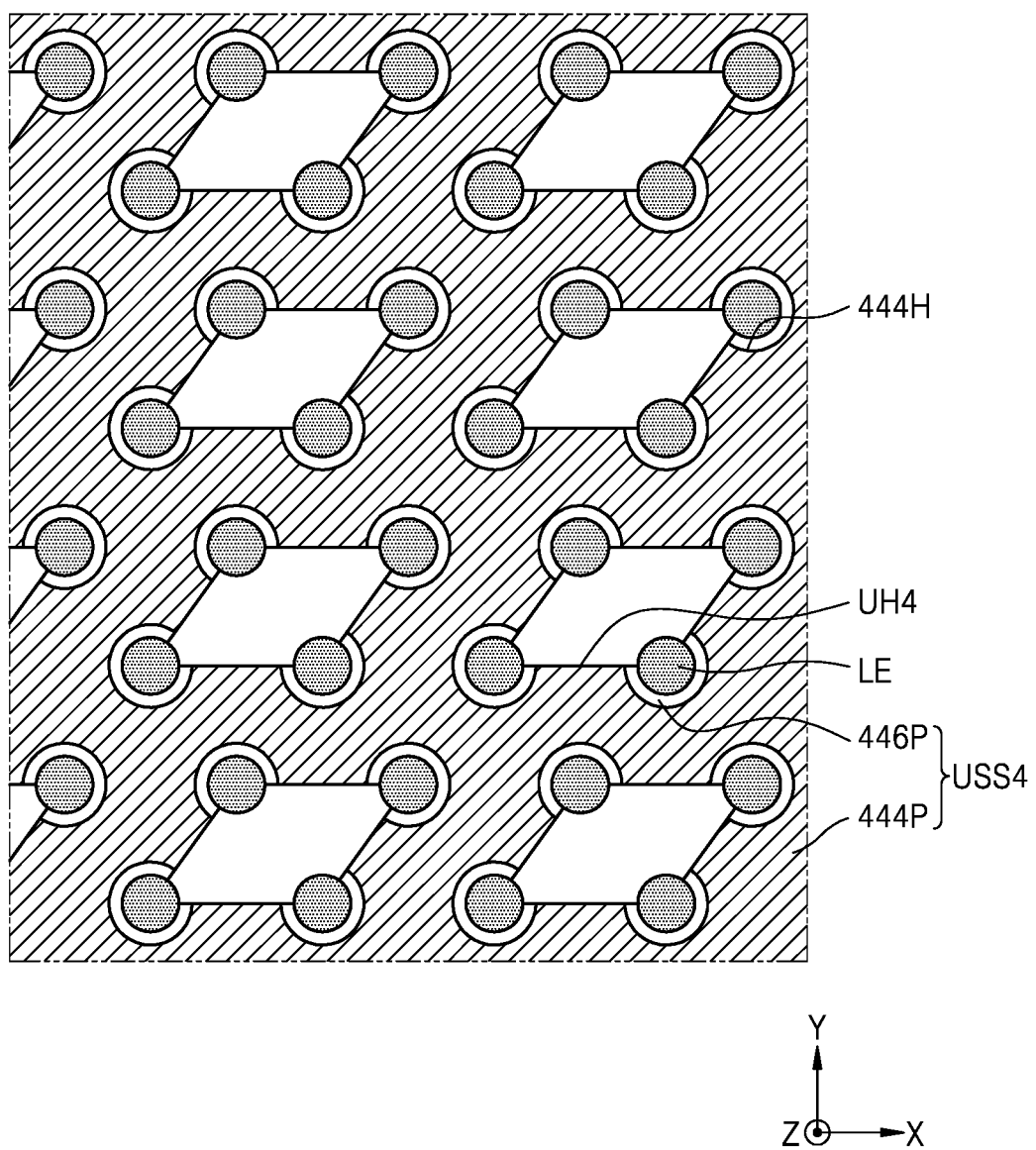
FIG. 5A is a plan view of some components of an IC device according to an embodiment.
Figure 5B:
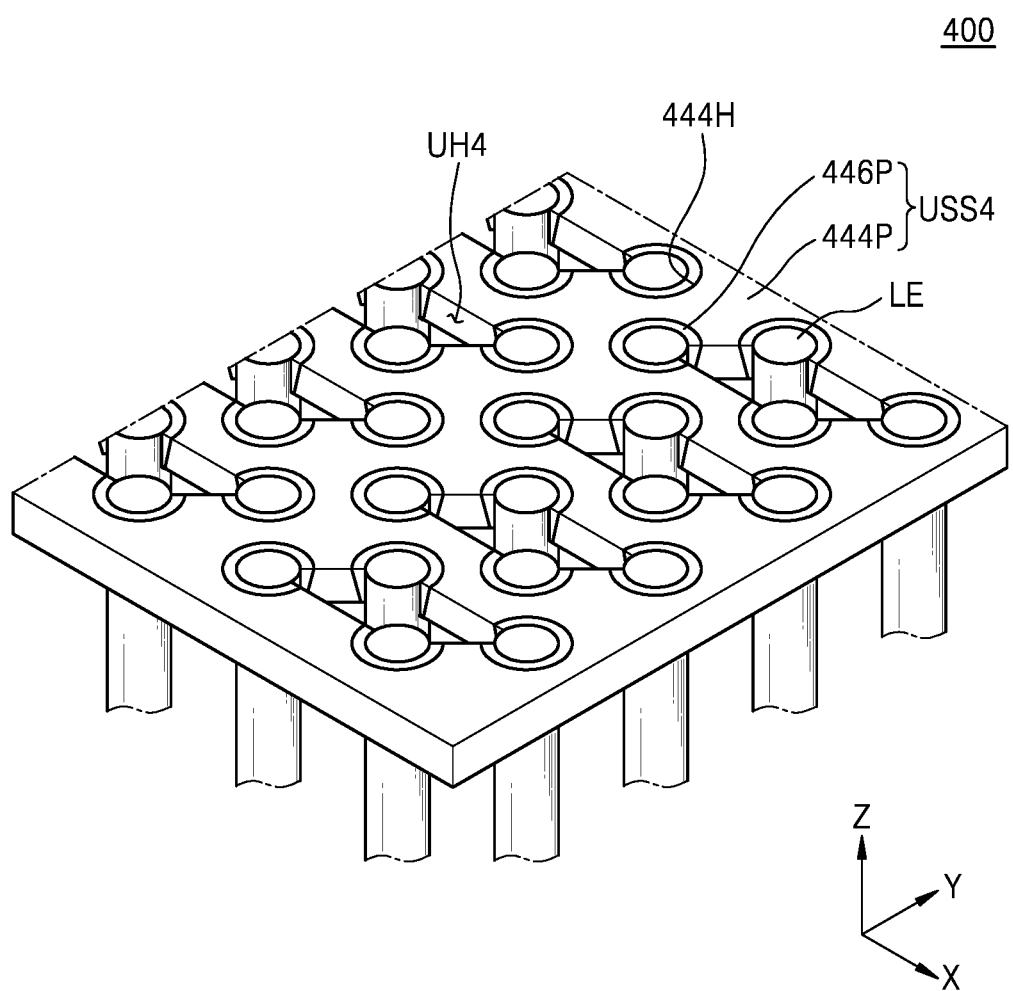
FIG. 5B is a schematic perspective view of some components of the IC device shown in FIG. 5A.

FIG. 5A is a plan view of some components of an IC device 400 according to an embodiment. FIG. 5B is a schematic perspective view of some components of the IC device 400 shown in FIG. 5A. In FIGS. 5A and 5B, the same reference numerals are used to denote the same elements as in FIGS. 2A and 2B, and detailed descriptions thereof may be omitted.

Referring to FIGS. 5A and 5B, the IC device 400 may have substantially the same configuration as the IC device 100 described with reference to FIGS. 2A and 2B. However, the IC device 400 may include an upper support structure USS4 configured to support a plurality of lower electrodes LE.

The upper support structure USS4 may include an upper support pattern 444P and a plurality of upper spacer support patterns 446P. A plurality of holes 444H through which the plurality of lower electrodes LE pass may be formed in the upper support pattern 444P. The plurality of upper spacer support pattern 446P may be arranged inside the plurality of holes 444H formed in the upper support pattern 444P in a one-to-one manner. For example, each of the plurality of upper spacer support patterns 446P may be disposed between the upper support pattern 444P and a corresponding lower electrode LE inside the hole 444H formed in the upper support pattern 444P. Each of the plurality of upper spacer support patterns 446P may have an outer sidewall in contact with the upper support pattern 444P and an inner sidewall in contact with the lower electrode LE. Each of the plurality of upper spacer support patterns 446P may have a smaller width toward a substrate 110 in a lateral direction. For example, the thickness of each of the upper spacer support patterns 446P in the lateral direction may decrease from the top to the bottom of the upper spacer support pattern 446P.

A plurality of upper holes UH4 may be formed in the upper support pattern 444P. A planar shape of each of the plurality of upper holes UH4 may approximately be a parallelogram shape having four adjacent lower electrodes LE as vertices, and two diagonal lines of the approximately parallelogram shape, which connect diagonal ones of the four lower electrodes LE, may have different lengths. For example, each of the upper holes UH4 may have two pairs of parallel sides in a plan view. For example, diagonal lines of each of the upper holes UH4 connecting opposite vertices of the parallelogram in a plan view may have different lengths from each other. In certain embodiments, the sides the parallelogram shape of each of the upper holes UH4 in a plan view may have different lengths. For example, a pair of opposite sides parallel with each other in the parallelogram of each of the upper holes UH4 may have different lengths from the other pair of sides of the parallelogram of the upper hole UH4 in a plan view.

The other detailed configurations of the upper support pattern 444P and the plurality of upper spacer support patterns 446P may be substantially the same as those of the upper support pattern 144P and the upper spacer support patterns 146P described with reference to FIGS. 2A and 2B.

Figure 6A:
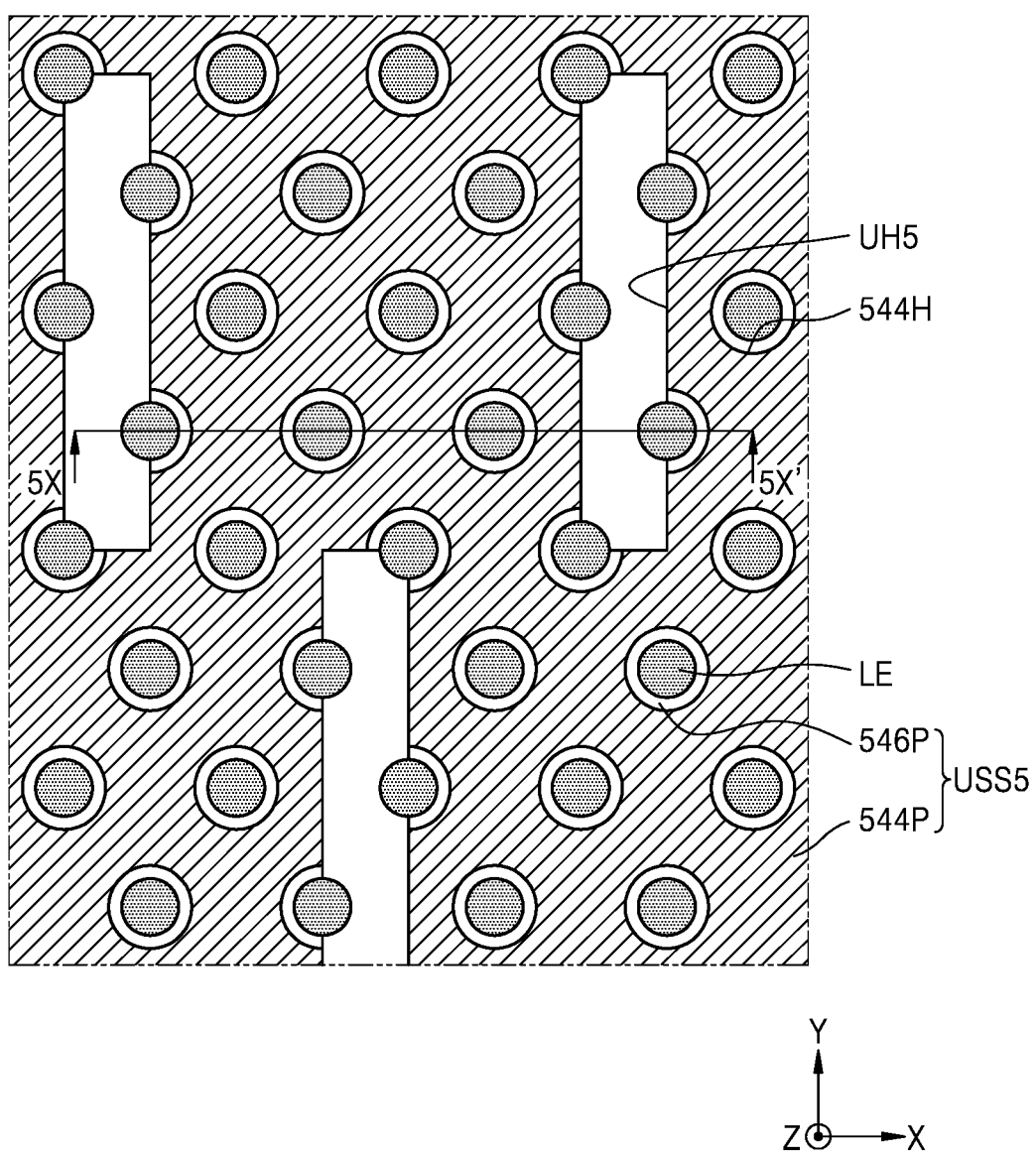
FIG. 6A is a plan view of some components of an IC device according to an embodiment.
Figure 6B:
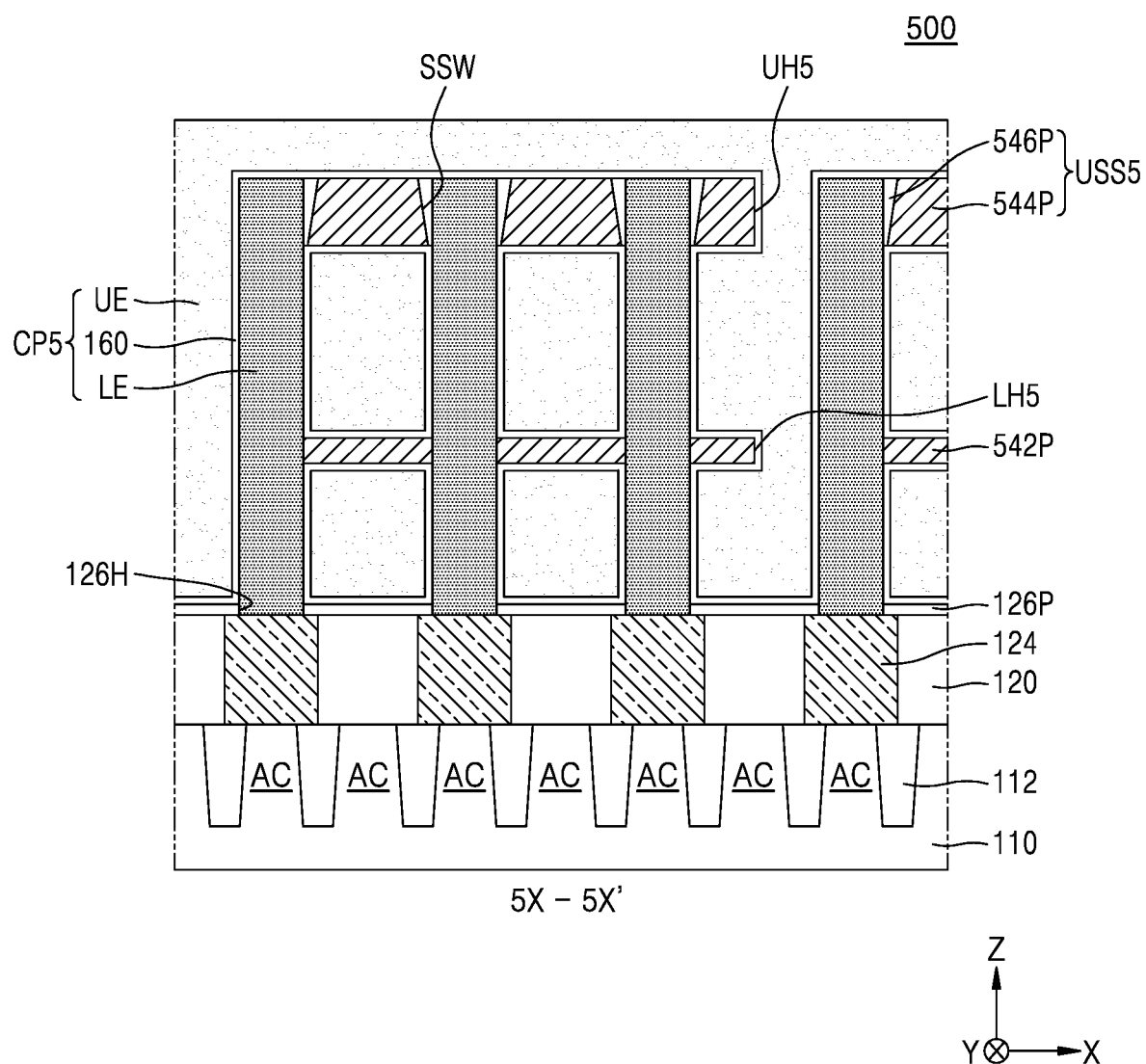
FIG. 6B is a schematic cross-sectional view of some components of the IC device, which is taken along line 5X-5X' of FIG. 6A.

FIG. 6A is a plan view of some components of an IC device 500 according to an embodiment. FIG. 6B is a schematic cross-sectional view of some components of the IC device 500, which is taken along line 5X-5X' of FIG. 6A. In FIGS. 6A and 6B, the same reference numerals are used to denote the same elements as in FIGS. 2A and 2B, and detailed descriptions thereof may be omitted.

Referring to FIGS. 6A and 6B, the IC device 500 may have substantially the same configuration as the IC device 100 described with reference to FIGS. 2A and 2B. However, the IC device 500 may include a plurality of capacitors CP5, which include a plurality of lower electrodes LE, a dielectric film 160, and an upper electrode UE, and may include a lower support pattern 542P and an upper support structure USS5, which support the plurality of lower electrodes LE.

The upper support structure USS5 may include an upper support pattern 544P and a plurality of upper spacer support patterns 546P. A plurality of holes 544H through which the plurality of lower electrodes LE pass may be formed in the upper support pattern 544P. The plurality of upper spacer support patterns 546P may be arranged inside the plurality of holes 544H formed in the upper support pattern 544P in a one-to-one manner. For example, each of the plurality of upper spacer support patterns 546P may be disposed between the upper support pattern 544P and the corresponding lower electrode LE inside the hole 544H formed in the upper support pattern 544P. Each of the plurality of upper spacer support patterns 546P may have an outer sidewall in contact with the upper support pattern 544P and an inner sidewall in contact with the lower electrode LE. Each of the plurality of upper spacer support patterns 546P may have a smaller width toward a substrate 110 in a lateral direction. For example, the thickness of each of the upper spacer support patterns 546P in the lateral direction may gradually decrease from the top to the bottom of the upper spacer support pattern 546P.

A plurality of upper holes UH5 may be formed in the upper support pattern 544P. Each of the plurality of upper holes UH5 may approximately have a rectangular planar shape, and five lower electrodes LE may be exposed at one upper hole UH5. A plurality of lower holes LH5, each of which has a planar shape corresponding to the planar shape of each of the plurality of upper holes UH5, may be formed in the lower support pattern 542P.

Each of the plurality of upper spacer support patterns 546P may have a ring shape, which is arranged concentrically with the lower electrode LE, e.g., in a plan view, and surrounds an upper end of the lower electrode LE. Some of the plurality of upper spacer support patterns 546P may surround the lower electrode LE in a closed ring shape at a position spaced apart from the plurality of upper holes UH5 in the lateral direction. Some others of the plurality of upper spacer support patterns 546P may not surround the lower electrode LE in a closed ring shape but surround the lower electrode LE in an open ring shape in which a portion of a closed ring is removed. An open portion omitted from a ring forming each of the plurality of upper spacer support patterns 546P may be included in the upper hole UH5. For example, the open portions omitted from the upper spacer support patterns 546P may be integrally formed with the upper holes UH5.

The other detailed configurations of the lower support pattern 542P, the upper support pattern 544P, and the plurality of upper spacer support patterns 546P may be substantially the same as those of the lower support pattern 142P, the upper support pattern 144P, and the upper spacer support pattern 146P described with reference to FIGS. 2A and 2B.

Figure 7:
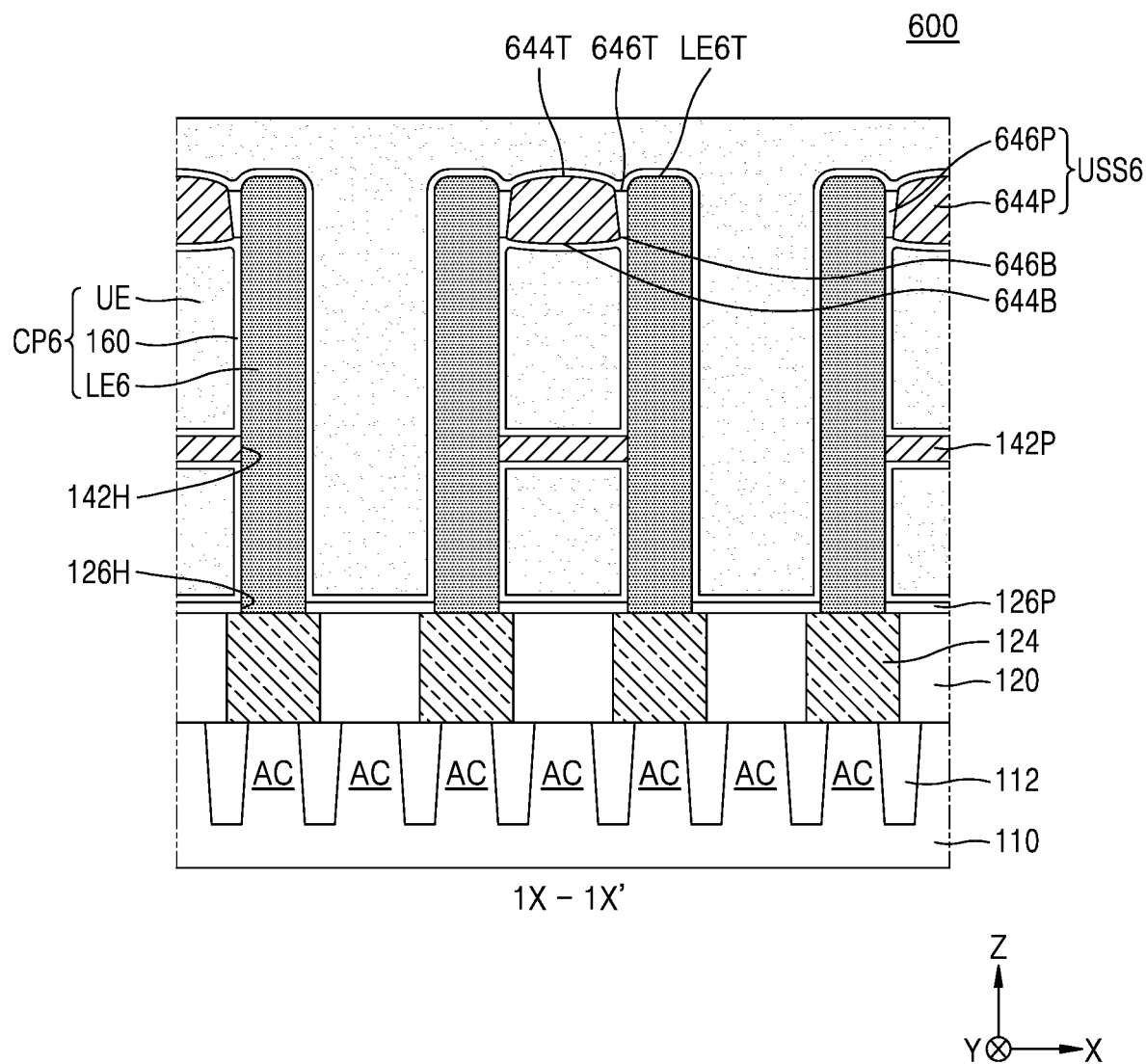
FIG. 7 is a cross-sectional view of some components of an IC device according to an embodiment.

FIG. 7 is a cross-sectional view of some components of an IC device 600 according to an embodiment. Some components of a portion corresponding to a cross-section taken along line 1X-1X' of FIG. 2A are schematically illustrated in FIG. 7. In FIG. 7, the same reference numerals are used to denote the same elements as in FIGS. 2A and 2B, and detailed descriptions thereof may be omitted.

Referring to FIG. 7, the IC device 600 may have substantially the same configuration as the IC device 100 described with reference to FIGS. 2A and 2B. However, the IC device 600 may include a plurality of capacitors CP6, which include a plurality of lower electrodes LE6, a dielectric film 160, and an upper electrode UE, and may include a lower support pattern 142P and an upper support structure USS6, which support the plurality of lower electrodes LE6.

The upper support structure USS6 may include an upper support pattern 644P and a plurality of upper spacer support patterns 646P. The upper support pattern 644P and the plurality of upper spacer support patterns 646P may have substantially the same configurations as the upper support pattern 144P and the plurality of upper spacer support patterns 146P described with reference to FIGS. 2A and 2B. However, each of a top surface 644T and a bottom surface 644B of the upper support pattern 644P may include a curved surface. The curved surface of the top surface 644T of the upper support pattern 644P may be convex in a direction away from a substrate 110, while the curved surface of the bottom surface 644B of the upper support pattern 644P may be convex toward the substrate 110. For example, both of the upper surface and the lower surface of the upper support pattern 644P may be convex, e.g., between two lower electrodes LE6, e.g., in a cross-sectional view. A radius of curvature of the top surface 644T may be less than a radius of curvature of the bottom surface 644B. For example, the upper surface of the upper support pattern 644P may be more convex (e.g., smaller radius of curvature) than the lower surface of the upper support pattern 644P, e.g., between two lower electrodes LE6, e.g., in a cross-sectional view, as shown in FIG. 7. Each of the plurality of upper spacer support patterns 646P may have a top surface 646T, which is at a level lower than an uppermost portion of the top surface 644T of the upper support pattern 644P, and a bottom surface 646B, which is at a level higher than a lowermost portion of the bottom surface 644B of the upper support pattern 644P. A vertical length of each of the plurality of upper spacer support patterns 646P may be less than a vertical length of the upper support pattern 644P.

The plurality of lower electrodes LE6 may have substantially the same configurations as the plurality of lower electrodes LE described with reference to FIGS. 2A and 2B. However, each of the plurality of lower electrodes LE6 may have a top surface LE6T that includes a convexly curved surface in a direction away from the substrate 110. The dielectric film 160 may conformally cover surfaces of the plurality of lower electrodes LE6, the lower support pattern 142P, the upper support pattern 644P, and the plurality of upper spacer support patterns 646P.

FIGS. 8A to 8H are cross-sectional views of a process sequence (steps) of a method of manufacturing an IC device, according to an embodiment. In FIGS. 8A to 8H, the same reference numerals are used to denote the same elements as in FIGS. 2A through 6B, and detailed descriptions thereof may be omitted.

Figure 8A:
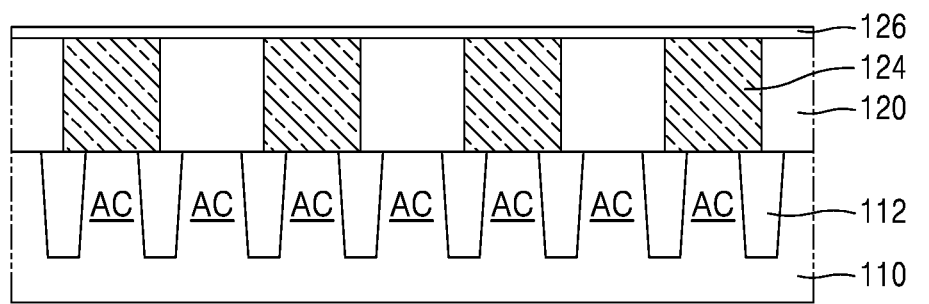
FIGS. 8A to 8H are cross-sectional views of a process sequence of a method of manufacturing an IC device, according to an embodiment.

Referring to FIG. 8A, a lower structure 120 and a conductive region 124 may be formed on a substrate 110 at which an active region AC is defined by a device isolation region 112. The conductive region 124 may pass through the lower structure 120 and be connected to the active region AC. Thereafter, an insulating film 126 may be formed to cover the lower structure 120 and the conductive region 124.

The insulating film 126 may be used as an etch stop layer during a subsequent process. The insulating film 126 may include an insulating material having an etch selectivity with respect to the lower structure 120. In some embodiments, the insulating film 126 may include a silicon nitride film, a silicon carbon nitride film, a boron-containing silicon nitride film, or a combination thereof.

Figure 8B:
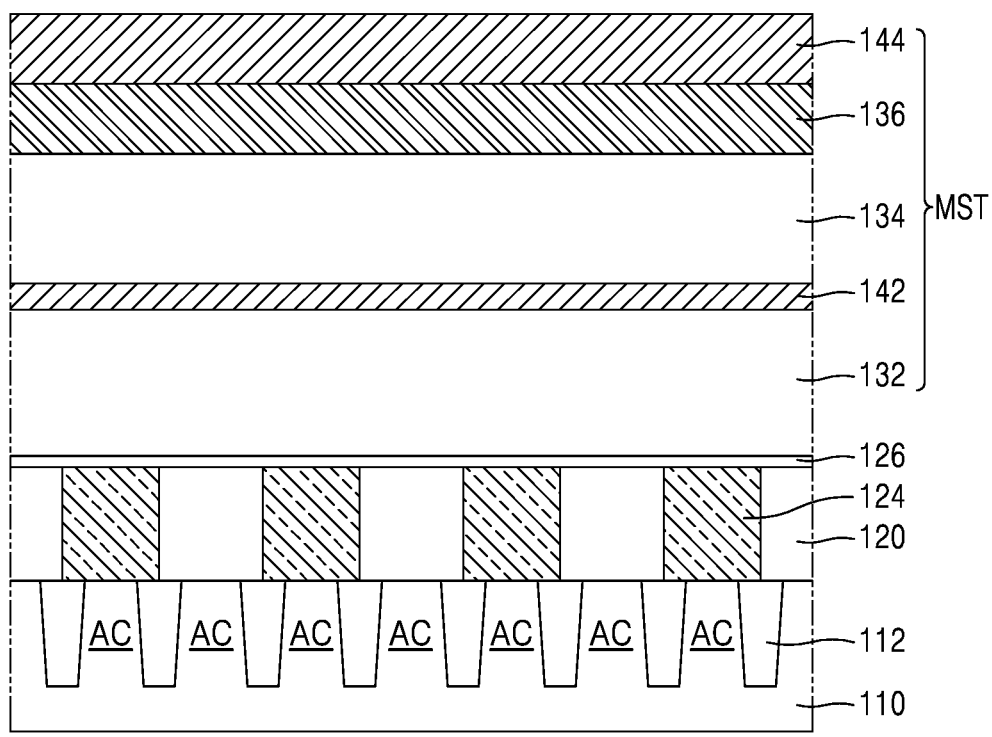

Referring to FIG. 8B, a mold structure MST may be formed on the insulating film 126.

The mold structure MST may include a plurality of mold films and a plurality of support films. For example, the mold structure MST may include a first mold film 132, a lower support film 142, a second mold film 134, a third mold film 136, and an upper support film 144, which are sequentially stacked on the insulating film 126. Each of the first mold film 132, the second mold film 134, and the third mold film 136 may include a material, which has a relatively high etch rate with respect to an etchant containing ammonium fluoride ($NH_4F$), hydrofluoric acid (HF), and water and may be removed by a lift-off process using the etchant. In some embodiments, each of the first mold film 132, the second mold film 134, and the third mold film 136 may include an oxide film, a nitride film, or a combination thereof. For example, the first mold film 132 may include a boro phospho silicate glass (BPSG) film. The BPSG film may include at least one of a first portion in which a concentration of a dopant B (or boron) varies in a thickness direction of the BPSG film and a second portion in which a concentration of a dopant P (or phosphorus) varies in the thickness direction of the BPSG film. The second mold film 134 may include a multi-layered insulating film obtained by alternately and repeatedly stacking a silicon oxide film and a silicon nitride film, each of which has a relatively small thickness, a plurality of times. The third mold film 136 may include a silicon nitride film. However, a material included in each of the first mold film 132, the second mold film 134, and the third mold film 136 is not limited to the above-described examples and may be variously modified and changed within the scope of the inventive concept. Also, a stacked order of the mold structure MST is not limited to the examples shown in FIG. 8B and may be variously modified and changed within the scope of the inventive concept.

Each of the lower support film 142 and the upper support film 144 may include a silicon carbon nitride film, a boron-containing silicon nitride film, or a combination thereof. In some embodiments, the lower support film 142 and the upper support film 144 may include the same material. In some other embodiments, the lower support film 142 and the upper support film 144 may include different materials. In an example, each of the lower support film 142 and the upper support film 144 may include a silicon carbon nitride film. In another example, the lower support film 142 may include a silicon carbon nitride film, and the upper support film 144 may include a boron-containing silicon nitride film. However, according to embodiments, materials included in the lower support film 142 and the upper support film 144 are not limited to the above-described examples and may be variously modified and changed within the scope of the inventive concept.

Figure 8C:
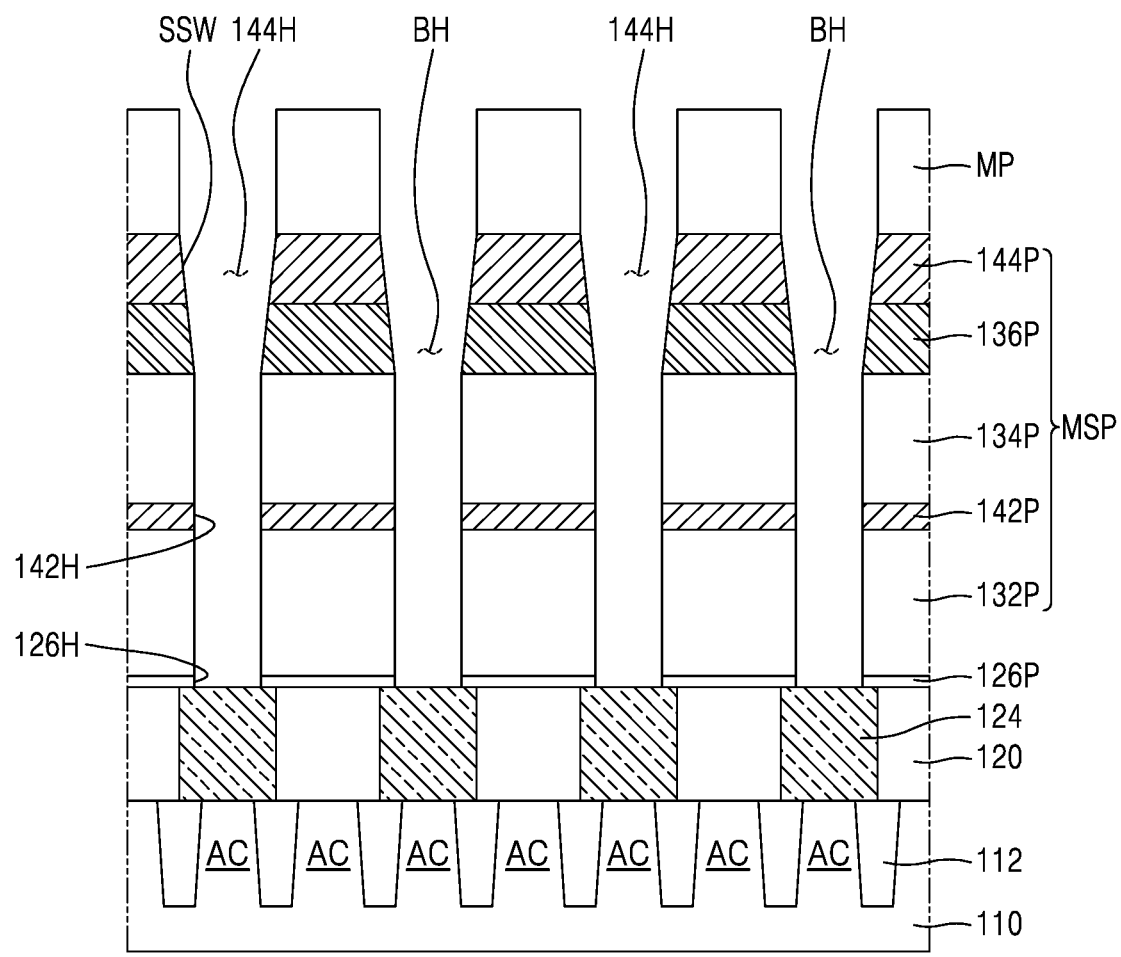

Referring to FIG. 8C, a mask pattern MP may be formed on the mold structure MST in the resultant structure of FIG. 8B, and the mold structure MST may be anisotropically etched using the mask pattern MP as an etch mask and using the insulating film 126 as an etch stop layer to form a plurality of holes BH. The mask pattern MP may include a nitride film, an oxide film, a polysilicon film, a photoresist film, or a combination thereof.

The process of forming the plurality of holes BH may further include a wet etching process etching/processing the resultant structure obtained by anisotropically etching the mold structure MST. During the process of anisotropically etching the mold structure MST and wet etching process etching/processing the resultant structure, a portion of the insulating film 126 may also be etched to form an insulating pattern 126P having a plurality of openings 126H exposing a plurality of conductive regions 124.

An example wet etching process etching/processing the resultant structure obtained by anisotropically etching the mold structure MST, an etchant including a diluted sulfuric acid peroxide (DSP) solution may be used. While the resultant structure obtained by anisotropically etching the mold structure MST is wet processed using the etchant, portions of the first mold film 132 and the second mold film 134, which are exposed to the etchant, may be removed. For example, when the first mold film 132 includes the BPSG film and a concentration of the dopant B or the dopant P in the BPSG film increases toward the substrate 110, an etched amount of the first mold film 132 due to the etchant may increase toward the substrate 110. Accordingly, the etched amount of the first mold film 132 due to the etchant may be larger near a bottom surface of the first mold film 132 than near a top surface thereof. Since the lower support film 142 between the first mold film 132 and the second mold film 134 has a smaller thickness than the first mold film 132 and the second mold film 134, portions of the lower support film 142, which are exposed to the etchant during the wet process, may be etched together with the first mold film 132 and the second mold film 134 by the etchant.

As a result, a mold structure pattern MSP defining the plurality of holes BH may be obtained. The mold structure pattern MSP may include a first mold pattern 132P, a lower support pattern 142P, a second mold pattern 134P, a third mold pattern 136P, and an upper support pattern 144P.

An etching selectivity of the third mold pattern 136P and the upper support pattern 144P with respect to the etchant for the wet process (e.g., wet etching process) may be lower than an etching selectivity of the first mold film 132 and the second mold film 134 with respect to the etchant. Thus, during the wet etching process etching/processing the resultant structure obtained by anisotropically etching the mold structure MST using the etchant, amounts of the third mold pattern 136P and the upper support pattern 144P, which are consumed due to the etchant, may be very small or little as compared to consumed amounts of the first mold film 132 and the second mold film 134. For example, etch rates of the third mold film 136 and the upper support film 144 with respect to the etchant (e.g., wet etchant) of the wet etching process may be lower than etch rates of the first mold film 132 and the second mold film 134 with respect to the etchant of the wet etching process. After the plurality of holes BH are formed, respective sidewalls of the first mold pattern 132P, the lower support pattern 142P, and the second mold pattern 134P, which define the plurality of holes BH in the mold structure pattern MSP, may be closer to a normal direction perpendicular to a main surface of the substrate 110 than sidewalls of the third mold film 136 and the upper support film 144, which define the plurality of holes BH. For example, side walls of lower portions of the holes BH formed with the first and second mold patterns and the lower support pattern 142P may be steeper (e.g., forms a more acute angle with the vertical direction) than side walls of upper portions of the holes BH. The third mold pattern 136P and the upper support pattern 144P may have a plurality of inclined sidewalls SSW defining the plurality of holes BH. Accordingly, portions of the plurality of holes BH, which pass through the third mold film 136 and the upper support film 144, may have different lateral sectional areas, which gradually increase in a direction away from the substrate 110. For example, a lateral sectional area of each of the holes BH in an upper level may be greater than a lateral sectional area of the same hole BH in a lower level. The plurality of inclined sidewalls SSW of the upper support pattern 144P may define the plurality of holes 144H.

Figure 8D:
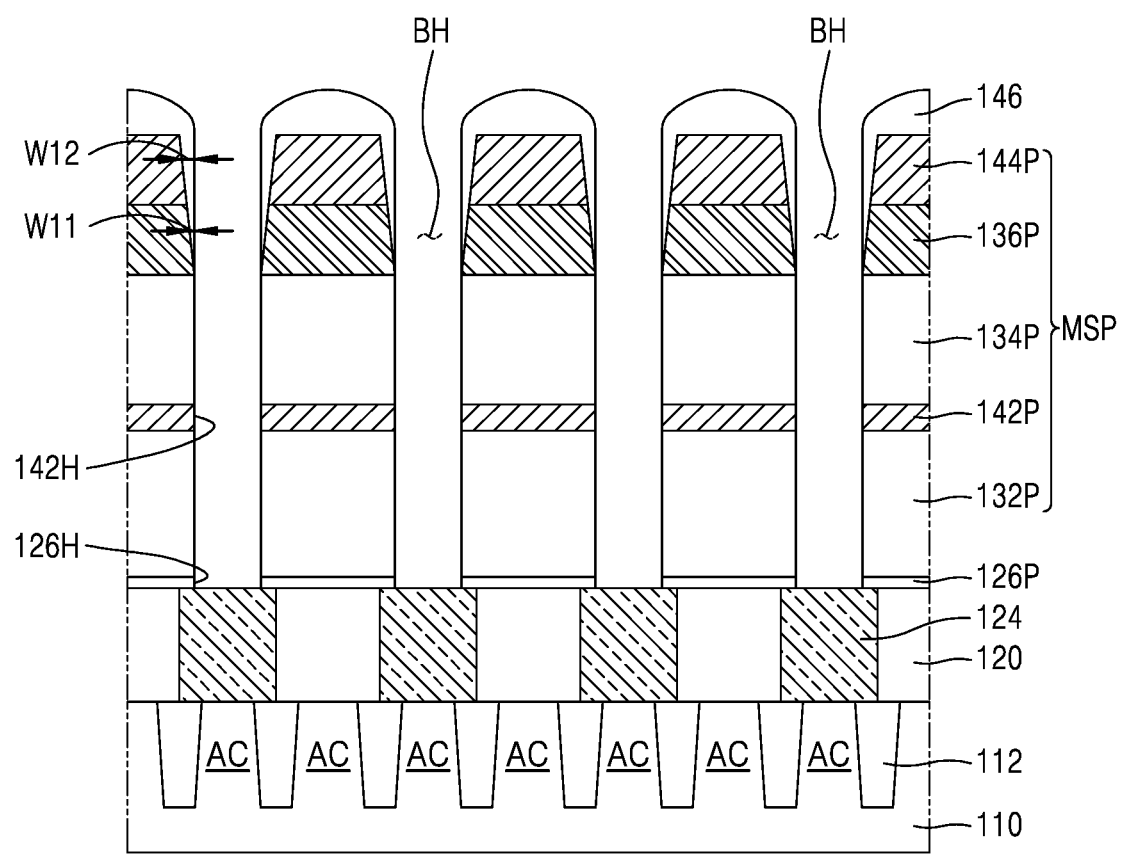

Referring to FIG. 8D, the mask pattern MP may be removed from the resultant structure of FIG. 8C, and an upper spacer support film 146 may be formed to cover an upper portion of the mold structure pattern MSP inside and outside each of the plurality of holes BH.

During the formation of the upper spacer support film 146, the upper spacer support film 146 may not be conformally formed on the mold structure pattern MSP but may be formed with deteriorated step coverage. For example, the upper spacer support film 146 may be formed in different thicknesses in different positions. For example, the upper spacer support film 146 may be formed on a portion of the resultant structure of the previous step as shown in FIG. 8D.

In some embodiments, the upper spacer support film 146 may be formed by using a chemical vapor deposition (CVD) process or a plasma-enhanced CVD (PECVD) process. In this case, by controlling a deposition atmosphere (e.g., a temperature, a pressure, a plasma formation condition, and the like) for forming the upper spacer support film 146 or by controlling flow rates of source gases in consideration of a sticking coefficient of each of atoms included in the upper spacer support film 146, the upper spacer support film 146 may be formed to cover only the upper portion of the mold structure pattern MSP.

The upper spacer support film 146 may be formed to cover only an exposed surface of each of the third mold pattern 136P and the upper support pattern 144P of the mold structure pattern MSP inside the plurality of holes BH. The upper spacer support film 146 may cover the mold structure pattern MSP to a greater thickness in a direction away from the substrate 110. For example, the thickness of the upper spacer support film 146 may be gradually increase from its bottom formed at the same level as the lower surface of the third mold pattern 136P to a top portion formed at the same level of the top surface of the mold structure pattern MSP. A lateral width W11 of a portion of the upper spacer support film 146, which covers and/or contacts the sidewall of the third mold pattern 136P, may be less than a lateral width W12 of a portion of the upper spacer support film 146, which covers and/or contacts the sidewall of the upper support pattern 144P.

The upper spacer support film 146 may include a silicon carbon nitride film, a boron-containing silicon nitride film, or a combination thereof.

In some embodiments, the upper support pattern 144P and the upper spacer support film 146 may include the same material. For example, each of the upper support pattern 144P and the upper spacer support film 146 may include a silicon carbon nitride film.

In some other embodiments, the upper support pattern 144P and the upper spacer support film 146 may include a first material including the same elements (e.g., the same chemical elements). In this case, the upper support pattern 144P and the upper spacer support film 146 may include the elements included in the first material at different contents. For example, each of the upper support pattern 144P and the upper spacer support film 146 may include a silicon carbon nitride film. In this case, a first carbon atom content of the silicon carbon nitride film included in the upper support pattern 144P may be different from a second carbon atom content of the silicon carbon nitride film included in the upper spacer support film 146. In some embodiments, the second carbon atom content of the upper spacer support film 146 may be higher than the first carbon atom content of the upper support pattern 144P. In this case, when the upper support pattern 144P and the upper spacer support film 146 are exposed to an etching atmosphere for etching another material film or a cleaning atmosphere during a subsequent process, etching resistances of the upper support pattern 144P and the upper spacer support film 146 may be improved due to a relatively high carbon content of the upper spacer support film 146 surrounding the upper support pattern 144P.

In some embodiments, a carbon content of the upper support pattern 144P may be selected in the range of about 3.5 at % to about 4.5 at %, and the carbon content of the upper spacer support film 146 may be selected in the range of about 4.5 at % to about 5.5 at %. For instance, the upper support pattern 144P may include a silicon carbon nitride film having a carbon content of about 3.7 at % to about 4.3 at %, and the upper spacer support film 146 may include a silicon carbon nitride film having a carbon content of about 4.7 at % to about 5.3 at %. When each of the upper support pattern 144P and the upper spacer support film 146 has an excessively low carbon content, each of the upper support pattern 144P and the upper spacer support film 146 may have an insufficient etching resistance when exposed to the etching atmosphere or the cleaning atmosphere.

In some other embodiments, the upper support pattern 144P and the upper spacer support film 146 may have different densities. For example, the upper support film 144 and the upper spacer support film 146 may include a material including the same elements (e.g., the same chemical elements). In this case, a density of the material included in the upper support pattern 144P may be higher than a density of the material included in the upper spacer support film 146. For example, the upper support pattern 144P may include a silicon carbon nitride film having a first density, and the upper spacer support film 146 may include a silicon carbon nitride film having a second density, the second density being lower than the first density.

In still other embodiments, the upper support film 144 and the upper spacer support film 146 may include different materials. In an example, the upper support film 144 may include a silicon carbon nitride film, and the upper spacer support film 146 may include a boron-containing silicon nitride film. In another example, the upper support film 144 may include a boron-containing silicon nitride film, and the upper spacer support film 146 may include a silicon carbon nitride film.

However, materials included in the upper support film 144 and the upper spacer support film 146 are not limited to the above-described examples and may be variously modified and changed within the scope of the inventive concept.

Figure 8E:
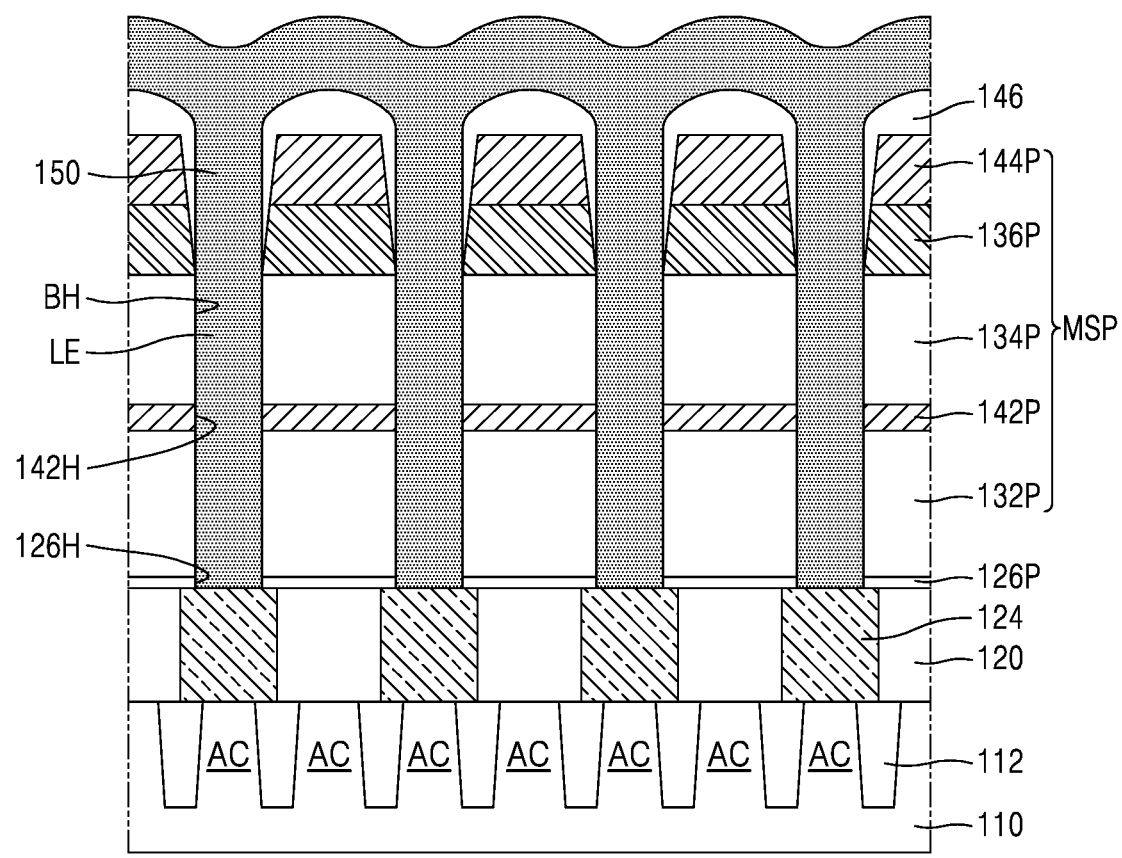

Referring to FIG. 8E, a conductive layer 150 may be formed on the resultant structure of FIG. 8D. The conductive layer 150 may be formed to fill the plurality of holes BH and cover a top surface of the upper spacer support film 146.

The conductive layer 150 may include a metal film, a conductive metal oxide film, a conductive metal nitride film, a conductive metal oxynitride film, or a combination thereof. In some embodiments, the conductive layer 150 may include titanium (Ti), Ti oxide, Ti nitride, Ti oxynitride, cobalt (Co), Co oxide, Co nitride, Co oxynitride, niobium (Nb), Nb oxide, Nb nitride, Nb oxynitride, tin (Sn), Sn oxide, Sn nitride, Sn oxynitride, or a combination thereof. For example, the conductive layer 150 may include TiN, CoN, NbN, $SnO_2$, or a combination thereof, but is not limited thereto. The conductive layer 150 may be formed using a CVD process, a PECVD process, a metal organic CVD (MOCVD) process, or an atomic layer deposition (ALD) process.

Figure 8F:
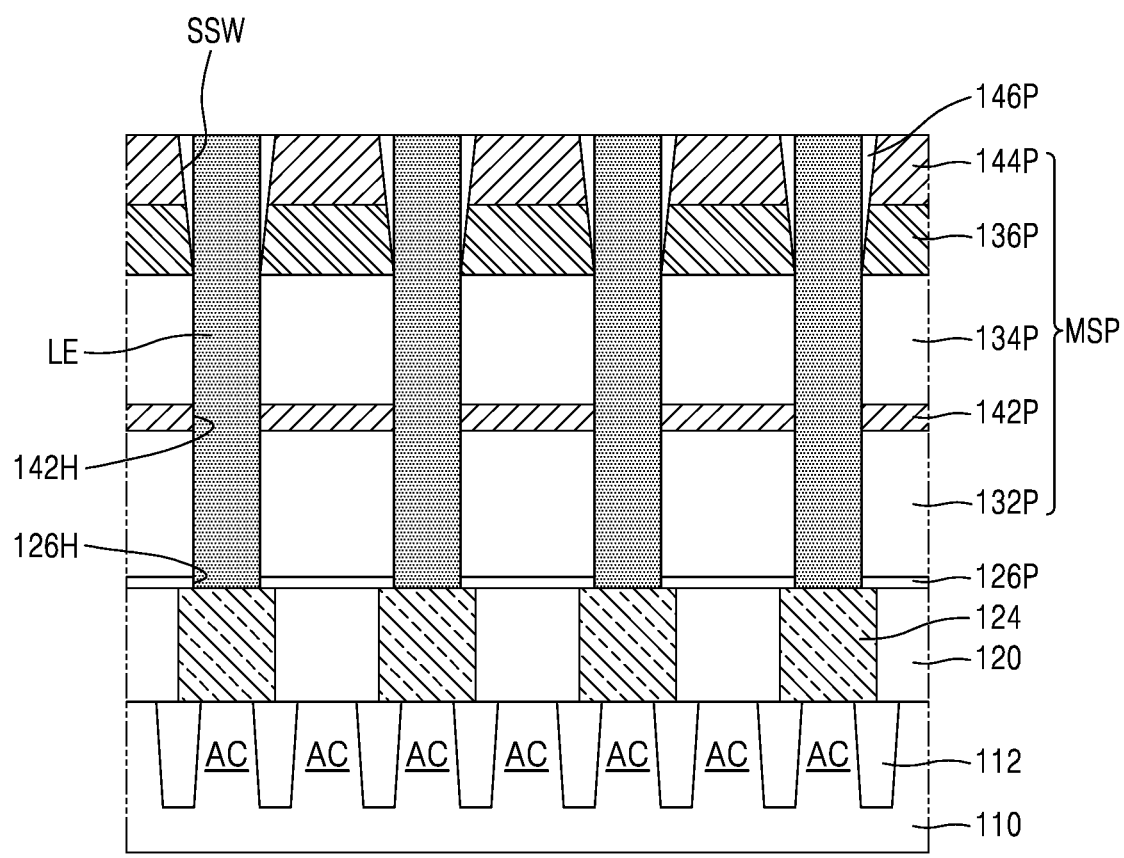

Referring to FIG. 8F, a portion of the conductive layer 150 and a portion of the upper spacer support film 146 may be removed from the resultant structure of FIG. 8E by performing an etchback process or a chemical mechanical polishing (CMP) process until a top surface of the upper support pattern 144P, which is an uppermost layer of the mold structure pattern MSP, is exposed. As a result, portions of the conductive layer 150, which remain inside the plurality of holes BH (refer to FIG. 8D), may form a plurality of lower electrode LE, and portions of the upper spacer support film 146, which remain inside the plurality of holes BH (refer to FIG. 8D), may form a plurality of upper spacer support patterns 146P.

The plurality of upper spacer support patterns 146P may remain in a plurality of ring shapes between the mold structure pattern MSP and the plurality of lower electrodes LE, respectively.

After the plurality of lower electrodes LE are formed, spaces between upper ends of the plurality of lower electrodes LE may remain in a state filled with the upper support pattern 144P including the inclined sidewalls SSW and the plurality of upper spacer support patterns 146P covering the inclined sidewalls SSW of the upper support pattern 144P. Since the plurality of upper spacer support patterns 146P remain between the upper support pattern 144P and the plurality of lower electrodes LE, respectively, separation distances between the upper ends of the plurality of lower electrodes LE may be maintained.

Figure 8G:
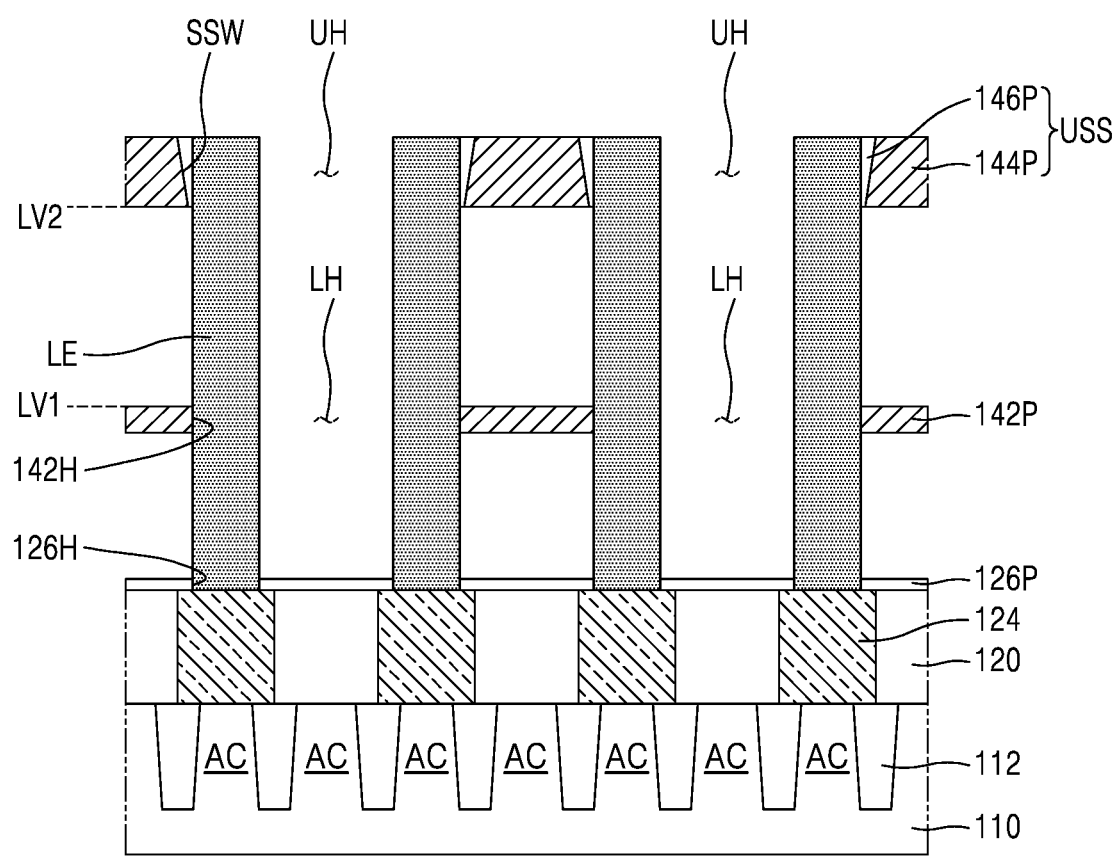

Referring to FIG. 8G, portions of the upper support pattern 144P and the plurality of upper spacer support patterns 146P may be removed from the resultant structure of FIG. 8F to form a plurality of upper holes UH. Thereafter, the third mold pattern 136P and the second mold pattern 134P may be removed through the plurality of upper holes UH, e.g., by a wet etching process. Next, portions of the lower support pattern 142P, which are exposed through the plurality of upper holes UH, may be removed to form a plurality of lower holes LH. Thereafter, the first mold pattern 132P may be removed through the plurality of lower holes LH, e.g., by a wet etching process to expose a top surface of the insulating pattern 126P.

By varying a planar shape of each of the plurality of upper holes UH and the plurality of lower holes LH, planar shapes of the upper holes UH and the lower holes LH may be variously modified. For example, the upper holes UH and/or the lower holes LH may have planar shapes of the plurality of upper holes UH having the planar shape shown in FIG. 2A, the plurality of upper holes UH4 having the planar shape shown in FIGS. 5A and 5B, and/or the plurality of upper holes UH5 having the planar shape shown in FIG. 6A.

After the first mold pattern 132P, the second mold pattern 134P, and the third mold pattern 136P are removed, sidewalls of the plurality of lower electrodes LE may be exposed, and the upper support pattern 144P and the plurality of upper spacer support patterns 146P, which remain in spaces between the plurality of lower electrodes LE, may constitute an upper support structure USS.

The wet etching process removing the third mold pattern 136P and the second mold pattern 134P and the wet etching process removing the first mold pattern 132P may be performed using an etchant containing ammonium fluoride (NH$_4$F), hydrofluoric acid (HF), and water. During the wet etching process removing the third mold pattern 136P and the second mold pattern 134P, portions of the upper spacer support patterns146P, which remains between the third mold pattern 136P and the lower electrode LE, may also be exposed to the etchant. Since portions of the plurality of upper spacer support patterns 146P, which are between the third mold pattern 136P and the lower electrode LE, have a relatively small lateral width W11 as described above with reference to FIG. 8D, a lower portion of each of the plurality of upper spacer support patterns 146P exposed to the etchant may also be removed by the etchant during the wet etching process removing the third mold pattern 136P and the second mold pattern 134P. As a result, portions of the plurality of upper spacer support patterns 146P may remain only between the upper support pattern 144P and the plurality of lower electrodes LE.

In some embodiments, the plurality of upper spacer support patterns 146P may not remain between a top level LV1 of the lower support pattern 142P and a bottom level LV2 of the upper support pattern 144P, and the sidewalls of the lower electrodes LE may be exposed.

In some other embodiments, in the resultant structure obtained by wet etching process removing the third mold pattern 136P and the second mold pattern 134P, at least portions of the plurality of upper spacer support patterns 146P may remain extended toward the substrate 110 to a level LV3 (refer to FIG. 3), which is lower than the bottom level LV2 of the upper support pattern 144P, to cover the sidewalls of the lower electrodes LE between the top level LV1 of the lower support pattern 142P and the bottom level LV2 of the upper support pattern 144P. In this case, upper spacer support patterns 246P having protrusions PR2 may be obtained as shown in FIG. 3.

In still other embodiments, during the wet etching process removing the third mold pattern 136P and the second mold pattern 134P, portions of the plurality of upper spacer support patterns 146P, which remain between the upper support pattern 144P and the plurality of lower electrodes LE, may be removed. As a result, as shown in FIG. 4, a plurality of upper spacer support patterns 346P having bottom surfaces RS3 located at a level LV4 higher than the bottom level LV2 of the upper support pattern 144P may be obtained.

In yet other embodiments, during the wet etching process removing the third mold pattern 136P and the second mold pattern 134P, a portion of each of the plurality of lower electrodes LE, a portion of the upper support pattern 144P, and a portion of each of the plurality of upper spacer support patterns 146P may be removed from the resultant structure of FIG. 8F. As a result, as shown in FIG. 7, an upper support pattern 644P having a top surface 644T and a bottom surface 644B, each of which includes a convexly curved surface, a plurality of upper spacer support patterns 646P each having a vertical length less than a vertical length of the upper support pattern 644P, and a plurality of lower electrodes LE6 each having a top surface LE6T that includes a convexly curved surface may be obtained.

Figure 8H:
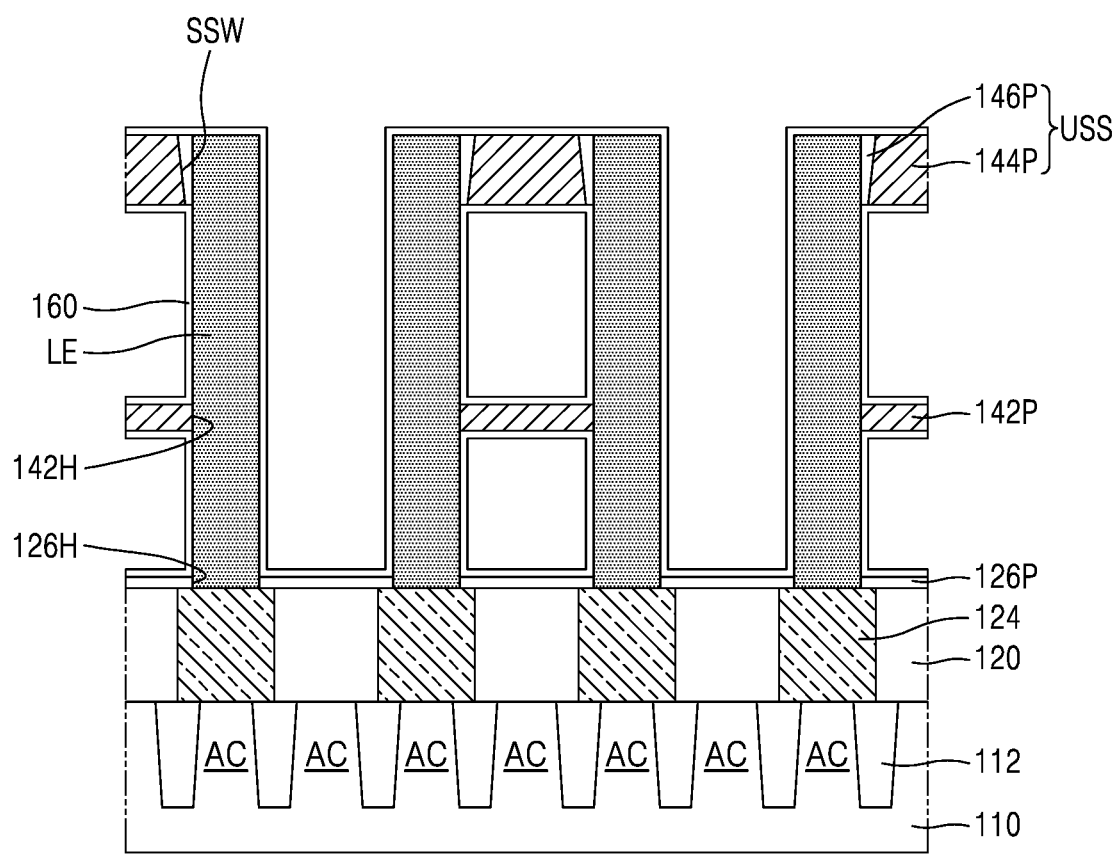

Referring to FIG. 8H, a dielectric film 160 may be formed to cover exposed surfaces of the lower electrodes LE.

The dielectric film 160 may be formed using an ALD process. The dielectric film 160 may include HfO$_2$, ZrO$_2$, Al$_2$O$_3$, La$_2$O$_3$, Ta$_2$O$_3$, Nb$_2$O$_5$, CeO$_2$, TiO$_2$, GeO$_2$, or a combination thereof, but is not limited thereto.

Thereafter, an upper electrode UE may be formed on the resultant structure of FIG. 8H to cover the dielectric film 160, thereby manufacturing the IC device 100 including the capacitor CP1 shown in FIG. 2B. The upper electrode 170 may be formed using a CVD process, an MOCVD process, a physical vapor deposition (PVD) process, or an ALD process.

In the method of manufacturing the IC device described with reference to FIGS. 8A to 8H, spaces between the upper ends of the plurality of lower electrodes LE may be filled with the upper support pattern 144P and the upper spacer support pattern 146P. Thus, a sufficient separation distance may be ensured between the upper ends of the plurality of lower electrodes LE. Accordingly, even if heights of the plurality of lower electrodes LE are increased and aspect ratios of the plurality of lower electrodes LE are relatively increased to improve capacitances, the plurality of lower electrodes LE may be prevented from being tilted or collapsing. As a result, the occurrence of undesired short circuits between adjacent lower electrodes LE may be prevented, and the mass production efficiency and reliability of the IC device may be improved.

While the inventive concept has been particularly shown and described with reference to embodiments thereof, it will be understood that various changes in form and details may be made therein without departing from the spirit and scope of the following claims.

What is claimed is:

1. An integrated circuit device comprising:
a lower electrode formed on a substrate; and
an upper support structure configured to support the lower electrode, the upper support structure disposed around the lower electrode,
wherein the upper support structure comprises:
an upper support pattern surrounding the lower electrode and extending in a lateral direction parallel to the substrate, the upper support pattern having a hole through which the lower electrode passes; and
an upper spacer support pattern between the upper support pattern and the lower electrode inside the hole and having an outer sidewall in contact with the upper support pattern and an inner sidewall in contact with the lower electrode, wherein a width of the upper spacer support pattern in the lateral direction decreases in a direction toward the substrate.

2. The integrated circuit device of claim 1, wherein
the upper support pattern has an inclined sidewall, which is located apart from and opposite to the lower electrode with the upper spacer support pattern therebetween, and
the inclined sidewall of the upper support pattern becomes closer in the lateral direction to the lower electrode, in the direction toward the substrate.

3. The integrated circuit device of claim 1, wherein
the upper spacer support pattern has a ring shape, which is arranged concentrically with the lower electrode and surrounds an upper end of the lower electrode.

4. The integrated circuit device of claim 1, wherein
the upper spacer support pattern includes a portion having a trapezoidal sectional shape or a triangular sectional shape of which a width is reduced in a direction toward the substrate.

5. The integrated circuit device of claim 1, wherein
the upper spacer support pattern comprises a silicon carbon nitride film, a boron-containing silicon nitride film, or a combination thereof.

6. The integrated circuit device of claim 1, wherein
the upper support pattern and the upper spacer support pattern comprise the same material.

7. The integrated circuit device of claim 1, wherein
the upper support pattern and the upper spacer support pattern comprise different materials.

8. The integrated circuit device of claim 1, wherein
the upper support pattern and the upper spacer support pattern comprise the same chemical elements, and contents of the chemical elements included in the upper support pattern and the upper spacer support pattern are different.

9. The integrated circuit device of claim 1, wherein
the upper support pattern comprises a silicon carbon nitride film having a first carbon atom content,
the upper spacer support pattern comprises a silicon carbon nitride film having a second carbon atom content, and
the second carbon atom content is higher than the first carbon atom content.

10. The integrated circuit device of claim 1, wherein
the upper support pattern has a first carbon atom content that is selected in a range of 3.5 atomic percent (at %) to 4.5 at %, and
the upper spacer support pattern has a second carbon atom content that is selected in a range of 4.5 at % to 5.5 at % and is higher than the first carbon atom content.

11. The integrated circuit device of claim 1, wherein
the upper support pattern has a first density, and
the upper spacer support pattern has a second density, the second density being lower than the first density.

12. The integrated circuit device of claim 1, wherein
the upper support pattern has a top surface, which includes a convexly curved surface in a direction away from the substrate, and a bottom surface, which includes a convexly curved surface in a direction toward the substrate.

13. An integrated circuit device comprising:
a plurality of lower electrodes arranged on a substrate and spaced apart from each other;
an upper support pattern extending in a lateral direction parallel to the substrate, the upper support pattern having a plurality of holes through which the plurality of lower electrodes pass; and
a plurality of upper spacer support patterns arranged inside the plurality of holes in a one-to-one manner, and
each of the plurality of upper spacer support patterns comprises an outer sidewall in contact with the upper support pattern and an inner sidewall in contact with a corresponding one of the plurality of lower electrodes, and has a width in the lateral direction decreasing in a direction toward the substrate.

14. The integrated circuit device of claim 13, wherein
the upper support pattern has a top surface, which includes a surface convexly curved in a direction away from the substrate, and a bottom surface, which includes a surface convexly curved in a direction toward the substrate, and
each of the plurality of upper spacer support patterns has a ring shape, which is arranged concentrically with the corresponding lower electrode and surrounds the corresponding lower electrode, and
at least one of the plurality of upper spacer support patterns has an open ring shape in which a portion of a closed ring is removed.

15. The integrated circuit device of claim 13, wherein
each of the plurality of upper spacer support patterns comprises a silicon carbon nitride film, a boron-containing silicon nitride film, or a combination thereof, and
a carbon atom content of each of the plurality of upper spacer support patterns is higher than a carbon atom content of the upper support pattern.

16. The integrated circuit device of claim 13, wherein
a density of each of the plurality of upper spacer support patterns is lower than a density of the upper support pattern.

17. The integrated circuit device of claim 13, further comprising a lower support pattern extending in the lateral direction between the substrate and the upper support pattern, the lower support pattern being in contact with the plurality of lower electrodes, wherein a carbon atom content of each of the plurality of upper spacer support patterns is higher than a carbon atom content of the lower support pattern, and a density of each of the plurality of upper spacer support patterns is lower than a density of the lower support pattern.

18. An integrated circuit device comprising:

a plurality of lower electrodes arranged on a substrate and spaced apart from each other;

an upper support structure comprising an upper support pattern and a plurality of upper spacer support patterns, the upper support pattern extending in a lateral direction parallel to the substrate and having a plurality of holes through which the plurality of lower electrodes pass, the plurality of upper spacer support patterns arranged inside the plurality of holes in a one-to-one manner;

a lower support pattern extending in the lateral direction between the substrate and the upper support structure and being in contact with the plurality of lower electrodes;

a dielectric film being in contact with the plurality of lower electrodes, the upper support pattern, the plurality of upper spacer support patterns, and the lower support pattern; and an upper electrode located opposite to the plurality of lower electrodes with the dielectric film therebetween, wherein each of the plurality of upper spacer support patterns has an outer sidewall in contact with the upper support pattern inside a corresponding one of the plurality of holes and an inner sidewall in contact with a corresponding one of the plurality of lower electrodes, and has a width in the lateral direction, the width decreasing in a direction toward the substrate.

19. The integrated circuit device of claim 18, wherein the lower support pattern and the upper support pattern comprise the same material, the plurality of upper spacer support patterns and the upper and lower support patterns include carbon atoms, a carbon atom content of each of the plurality of upper spacer support patterns is higher than a carbon atom content of each of the lower support pattern and the upper support pattern, and a density of each of the plurality of upper spacer support patterns is lower than a density of each of the lower support pattern and the upper support pattern.

20. The integrated circuit device of claim 18, wherein each of the lower support pattern and the upper support pattern comprises a silicon carbon nitride film having a first carbon atom content that is selected in a range of 3.5 at % to 4.5 at %, and each of the plurality of upper spacer support patterns comprises a silicon carbon nitride film having a second carbon atom content that is selected in a range of 4.5 at % to 5.5 at % and is higher than the first carbon atom content.

* * * * *

UNITED STATES PATENT AND TRADEMARK OFFICE
CERTIFICATE OF CORRECTION

PATENT NO. : 11,114,398 B2  
APPLICATION NO. : 16/848194  
DATED : September 7, 2021  
INVENTOR(S) : Kim et al.

Page 1 of 1

It is certified that error appears in the above-identified patent and that said Letters Patent is hereby corrected as shown below:

On the Title Page

Item (72) The following three inventors are being added:  
KIYOUL KIM, Seoul, KR  
JONGCHEON KIM, Hwaseong-si, KR  
HYONGSOO KIM, Hwaseong-si, KR Signed and Sealed this  
Seventh Day of June, 2022

Katherine Kelly Vidal  
*Director of the United States Patent and Trademark Office*